US009605983B2

(12) United States Patent
Ausserlechner

(10) Patent No.: US 9,605,983 B2
(45) Date of Patent: Mar. 28, 2017

(54) SENSOR DEVICE AND SENSOR ARRANGEMENT

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 104 days.

(21) Appl. No.: 14/299,563

(22) Filed: Jun. 9, 2014

(65) Prior Publication Data
US 2015/0354999 A1 Dec. 10, 2015

(51) Int. Cl.
G01R 33/02 (2006.01)
G01D 11/30 (2006.01)
(Continued)

(52) U.S. Cl.
CPC ........... *G01D 11/305* (2013.01); *G01D 5/142* (2013.01); *G01D 5/24442* (2013.01);
(Continued)

(58) Field of Classification Search
CPC ....... G01D 11/305; G01D 11/245; G01J 5/04; G01K 1/14; G10K 11/004; G01R 1/04; G01L 19/14; G01P 1/02
(Continued)

(56) References Cited

U.S. PATENT DOCUMENTS 3,823,354 A * 7/1974 Janssen ................. H01L 43/065
257/426

4,041,026 A 8/1977 Ogata
(Continued)

FOREIGN PATENT DOCUMENTS

CN 101762796 A 6/2010
CN 101923266 A 12/2010
(Continued)

OTHER PUBLICATIONS

RADIOING.com, Tips for Electronic Printed Circuit Board Design, "PCB Layout" section, Dec. 11, 2013.*
(Continued)

*Primary Examiner* — Patrick Assouad
*Assistant Examiner* — Sean Curtis
(74) *Attorney, Agent, or Firm* — Eschweiler & Potashnik, LLC

(57) ABSTRACT

A sensor arrangement according to an embodiment includes a board with a plurality of conductive lines of a first type, and a plurality of conductive lines of a second type different from the conductive lines of the first type, and a recess. The sensor arrangement further includes a plurality of sensor devices mechanically accommodated on a main surface of the board and arranged around the recess, each sensor device being electrically coupled to the conductive lines of the first type and at least to one of the conductive lines of the second type, wherein each conductive line of the second type electrically couples a sensor device with at least one other item different from the sensor devices of the plurality of sensor devices. A projection of the conductive lines of the first and second types perpendicular to the main surface is crossing-free. Each conductive line of the first type electrically couples at least all of the plurality of sensor devices.

15 Claims, 23 Drawing Sheets

(51) Int. Cl.
  *G01D 5/14* (2006.01)
  *G01D 5/244* (2006.01)
  *H05K 1/18* (2006.01)
(52) U.S. Cl.
  CPC .............. *H01L 2224/131* (2013.01); *H01L 2224/16227* (2013.01); *H01L 2224/48245* (2013.01); *H01L 2924/00014* (2013.01); *H05K 1/181* (2013.01); *H05K 2201/09063* (2013.01); *H05K 2201/09227* (2013.01); *H05K 2201/09409* (2013.01); *H05K 2201/09418* (2013.01); *H05K 2201/10151* (2013.01)
(58) Field of Classification Search
  USPC ...... 324/207.13, 207.21, 228, 234, 243–244, 324/247–248, 251–252
  See application file for complete search history.

(56) References Cited

U.S. PATENT DOCUMENTS

| | | | | |
|---|---|---|---|---|
| 5,055,786 | A * | 10/1991 | Wakatsuki | G01P 15/0802 324/207.21 |
| 5,278,497 | A * | 1/1994 | Ariyoshi | G01R 33/09 324/207.21 |
| 5,418,455 | A * | 5/1995 | Takaishi | G01B 7/003 174/261 |
| 5,548,151 | A * | 8/1996 | Funaki | H01L 43/065 257/421 |
| 5,646,527 | A * | 7/1997 | Mani | H01L 43/065 257/E43.002 |
| 5,747,995 | A | 5/1998 | Spies | |
| 6,064,202 | A | 5/2000 | Steiner | |
| 6,111,402 | A * | 8/2000 | Fischer | G01D 5/2046 324/207.17 |
| 6,326,782 | B1 * | 12/2001 | Schroeder | G01B 7/004 324/207.21 |
| 6,362,618 | B1 | 3/2002 | Motz | |
| 6,727,563 | B1 | 4/2004 | Hohe | |
| 6,768,301 | B1 | 7/2004 | Hohe et al. | |
| 6,946,834 | B2 * | 9/2005 | Van Zon | G01R 33/09 324/249 |
| 7,078,893 | B2 * | 7/2006 | Nakano | G01D 5/145 324/207.25 |
| 7,317,251 | B2 * | 1/2008 | Meyer-Berg | H01L 23/5389 257/723 |
| 7,425,821 | B2 | 9/2008 | Monreal | |
| 7,923,987 | B2 | 4/2011 | Ausserlechner | |
| 8,030,918 | B2 | 10/2011 | Doogue | |
| 8,058,866 | B2 * | 11/2011 | Granig | G01D 5/145 324/207.21 |
| 8,093,891 | B2 | 1/2012 | Rocznik | |
| 8,332,103 | B2 | 12/2012 | Greer et al. | |
| 8,659,411 | B2 | 2/2014 | Fink | |
| 8,829,900 | B2 | 9/2014 | Ausserlechner | |
| 8,896,303 | B2 | 11/2014 | Ausserlechner | |
| 8,903,602 | B2 | 12/2014 | Baille et al. | |
| 9,063,187 | B2 * | 6/2015 | Hellwig | G01R 33/07 |
| 9,103,853 | B2 * | 8/2015 | Ausserlechner | G01R 33/09 |
| 9,222,992 | B2 * | 12/2015 | Ausserlechner | G01R 15/202 |
| 9,279,864 | B2 * | 3/2016 | Ausserlechner | G01R 33/077 |
| 2003/0102909 | A1 | 6/2003 | Motz | |
| 2004/0085062 | A1 * | 5/2004 | Miyata | F02D 9/105 324/207.2 |
| 2005/0174112 | A1 * | 8/2005 | Wakabayashi | G01D 5/145 324/251 |
| 2005/0258840 | A1 | 11/2005 | Ausserlechner | |
| 2007/0170533 | A1 * | 7/2007 | Doogue | B82Y 25/00 257/422 |
| 2007/0200564 | A1 * | 8/2007 | Motz | G01R 33/095 324/247 |
| 2007/0210298 | A1 | 9/2007 | Finkelstein et al. | |
| 2008/0297955 | A1 | 12/2008 | Ausserlechner | |
| 2009/0001965 | A1 * | 1/2009 | Ausserlechner | G01D 5/145 324/202 |
| 2009/0322325 | A1 * | 12/2009 | Ausserlechner | G01D 5/145 324/260 |
| 2010/0156394 | A1 * | 6/2010 | Ausserlechner | G01R 15/202 324/144 |
| 2011/0071737 | A1 | 3/2011 | Greer | |
| 2011/0074405 | A1 | 3/2011 | Doogue | |
| 2011/0199623 | A1 | 8/2011 | Okuyama | |
| 2012/0001279 | A1 | 1/2012 | Hioka et al. | |
| 2012/0029767 | A1 | 2/2012 | Bailie | |
| 2013/0043865 | A1 * | 2/2013 | Makuth | G01R 33/07 324/251 |
| 2013/0085710 | A1 | 4/2013 | Kautzsch | |
| 2013/0265036 | A1 * | 10/2013 | Friedrich | G01R 33/0094 324/207.2 |
| 2013/0265041 | A1 * | 10/2013 | Friedrich | G01R 15/207 324/260 |
| 2013/0335072 | A1 * | 12/2013 | Malzfeldt | G01D 5/145 324/207.21 |
| 2014/0042410 | A1 * | 2/2014 | Chen | H01L 51/5203 257/40 |
| 2014/0176323 | A1 | 6/2014 | Kim | |
| 2014/0195107 | A1 | 7/2014 | Park et al. | |
| 2014/0203803 | A1 * | 7/2014 | Ming | G01R 15/202 324/251 |
| 2014/0218019 | A1 * | 8/2014 | Ausserlechner | G01R 15/20 324/251 |
| 2014/0266163 | A1 | 9/2014 | Schaffer | |
| 2015/0102808 | A1 * | 4/2015 | Ogomi | G01R 33/096 324/252 |
| 2015/0115932 | A1 | 4/2015 | Michelutti et al. | |
| 2015/0137797 | A1 * | 5/2015 | Ausserlechner | G01D 5/145 324/207.2 |
| 2015/0219472 | A1 * | 8/2015 | Ausserlechner | G01D 5/145 324/207.25 |
| 2015/0285661 | A1 * | 10/2015 | Ausserlechner | G01D 5/16 324/207.21 |
| 2015/0309127 | A1 * | 10/2015 | Ausserlechner | G01R 33/09 324/252 |
| 2015/0323568 | A1 * | 11/2015 | Schmitt | G01R 15/207 324/126 |
| 2015/0331070 | A1 * | 11/2015 | Koeck | G01D 5/145 324/252 |
| 2015/0354999 | A1 * | 12/2015 | Ausserlechner | G01D 11/305 73/866.5 |

FOREIGN PATENT DOCUMENTS

| | | |
|---|---|---|
| DE | 4302342 | 7/1993 |
| DE | 10150950 C1 | 6/2003 |
| DE | 102006037226 A1 | 2/2008 |
| EP | 1438755 | 1/2005 |
| JP | 1251763 | 10/1989 |
| WO | 2004/025742 | 3/2004 |
| WO | 2008/048379 A1 | 4/2008 |
| WO | 2009/050673 | 4/2009 |

OTHER PUBLICATIONS

Zhu et al., Localization of a Stationary Source within a Uniform Circular Sensor Array, IEEE, 2007.*
Baker, Bonnie. PCB signal coupling can be a problem, www.edn.com/electronics-blogs/bakers-best/4426162/PCB-signal-coupling-can-be-a-problem, Dec. 2013.*
Bailey, Michael. General Layout Guidelines for RF and Mixed-Signal PCBs. www.maximintegrated.com/en/app-notes/index.mvp/id/5100. Sep. 2011.*
Ausserlechner, Udo. "Limits of Offset Cancellation by the Principle of Spinning Current Hall Probe." Infineon Technologies AG, 4 pages, Oct. 2004.
Vanha, Ralph. "Trench-Hall Devices". Journal of Microelectronics Systems, vol. 9, No. 1, Mar. 2000, pp. 82-87.
Munter, P J A. "A Low-Offset Spinning-current Hall Plate." Sensors and Actuators, A21-A23, 1990, pp. 743-746.
De Jong, Paul C. "40.1 Smart Silicon Sensors—Examples of Hall-effect Sensors." Sensors 2002 Proceedings of IEEE, 5 pages.

(56) References Cited

OTHER PUBLICATIONS

Chinese Office Action, Application No. 201210345928.4, dated Oct. 10, 2014, 14 pages.
Notice of Allowance, U.S. Appl. No. 13/753,190 dated Jun. 23, 2015.
Final Office Action, U.S. Appl. No. 13/753,190 dated Apr. 6, 2015.
Non-Final Office Action, U.S. Appl. No. 13/753,190 dated Oct. 8, 2014.
Infineon Technologies AG, *Angle Sensor GMR-Based Angular Sensor TLE5009*, Rev. 1.1, dated Apr. 2012, 32 pages.
Infineon Technologies AG, Package Informatim SOT23 as available at https://www.infineon.com/dgdl/SOT23-Package_Overview.pdf?folder Id=db3a30431936bc4b0119532290053c66&fileld=db3a30431936bc4b0119533468123c85 as of Jun. 4, 2014, 1 page.
Infineon Technologies AG, *Chip Card & Security ICs SLM76CF5120P*, 9 pages, © Infineon Technologies AG 2007.
Infineon Technologies AG, Angle Sensor GMR-Based Angle Sensor TLE5012B, V. 1.1, Jan. 2012, 49 pages.
Non-Final Office Action dated Jun. 17, 2016 for U.S. Appl. No. 14/886,864.
Non Final Office Action Dated Oct. 14, 2016 U.S. Appl. No. 14/886,864.
Non Final Office Action Dated Oct. 31, 2016 U.S. Appl. No. 14/317,063.

\* cited by examiner

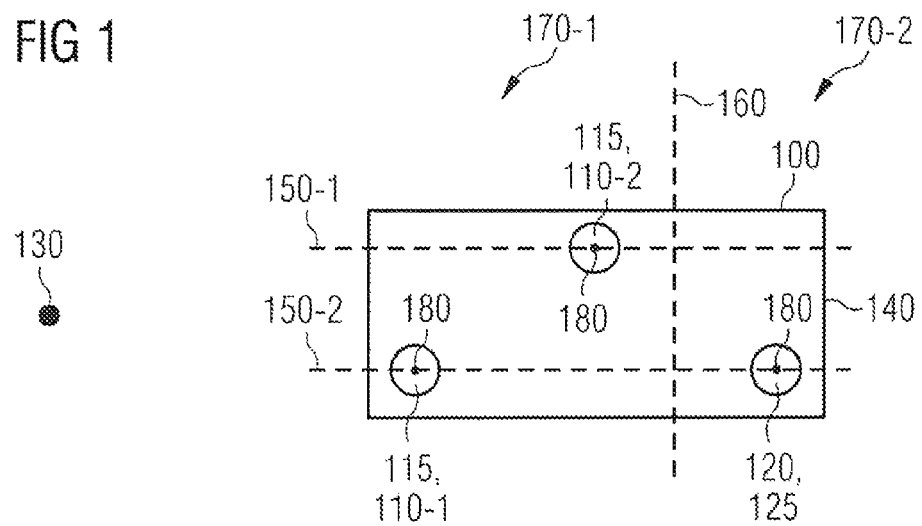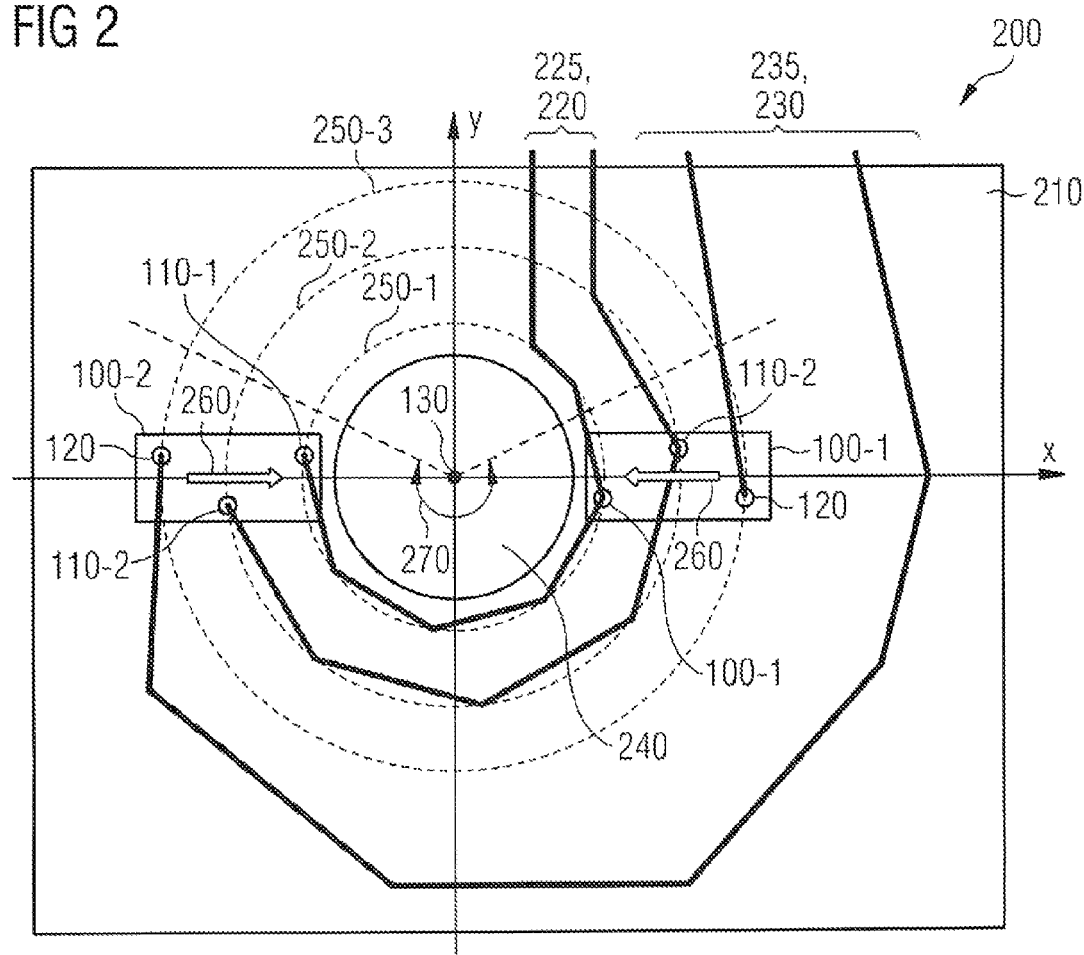

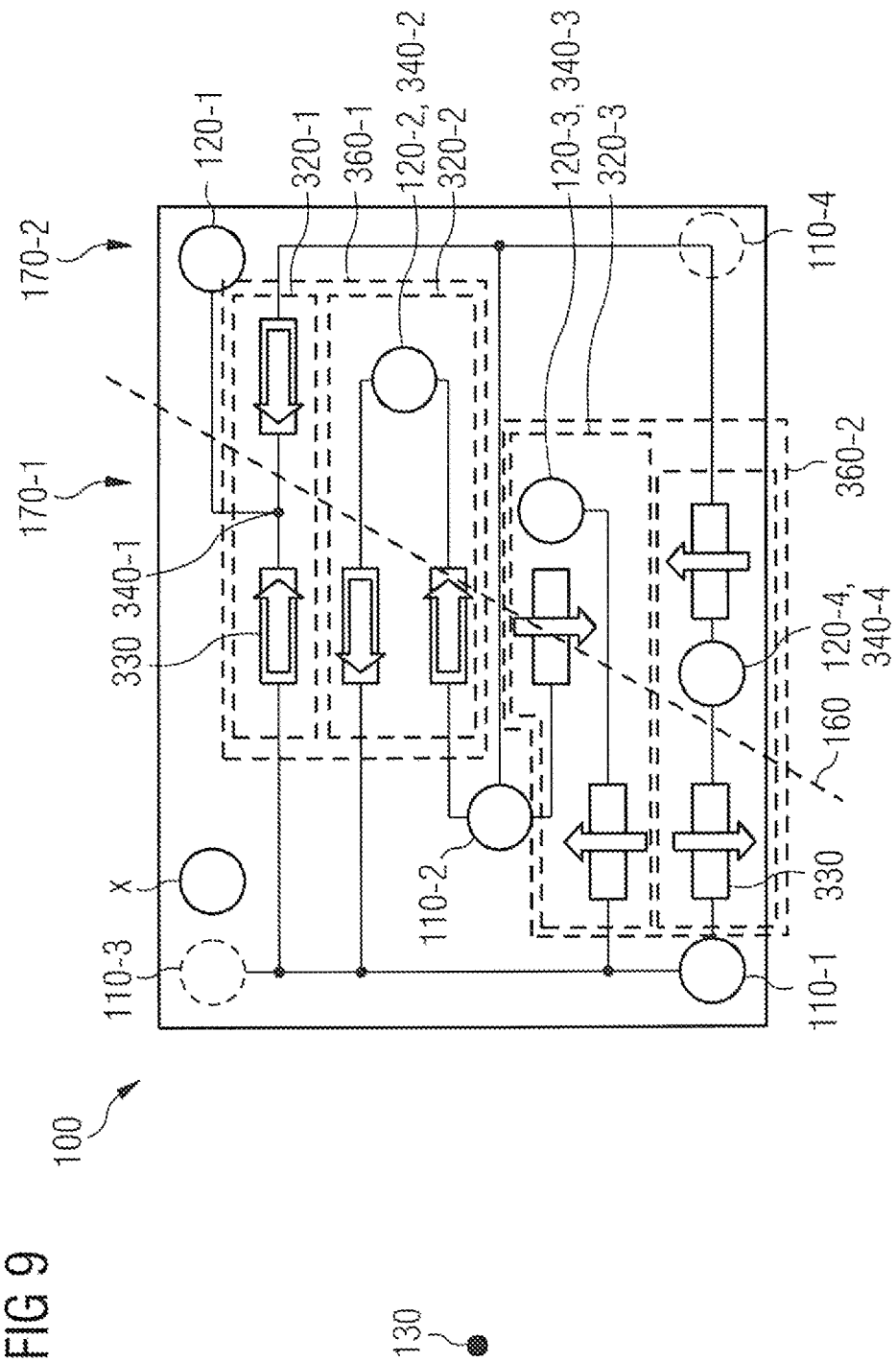

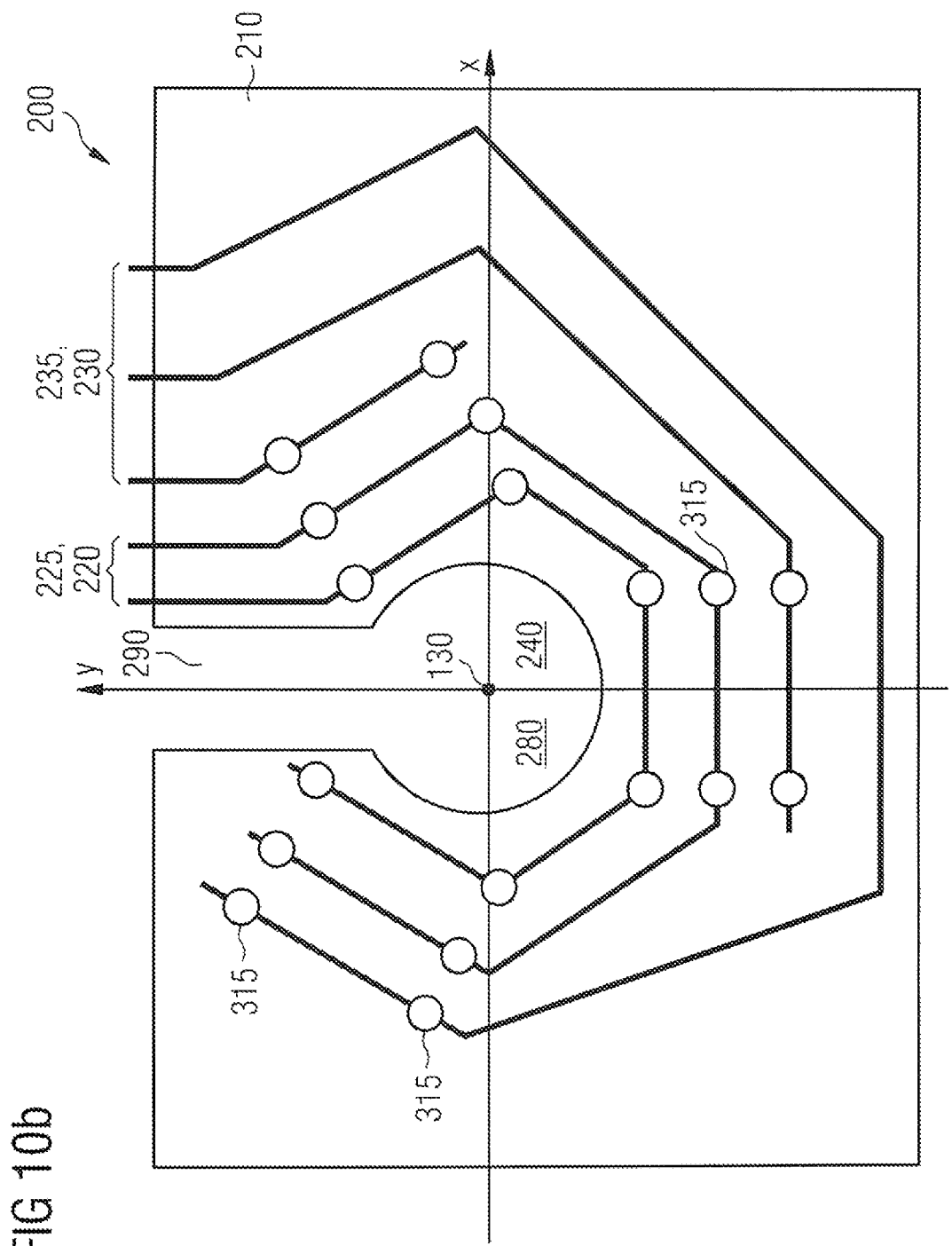

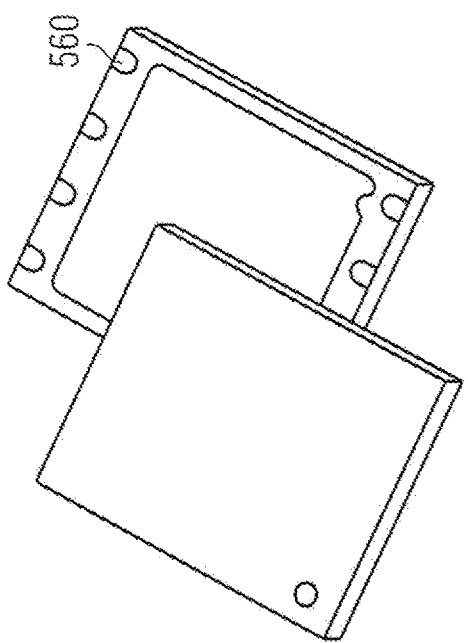
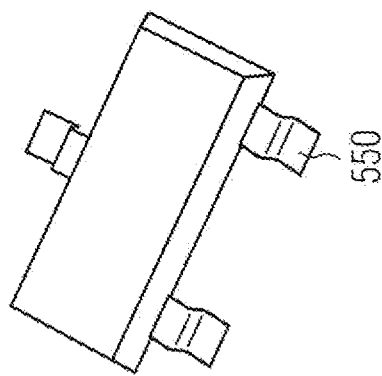
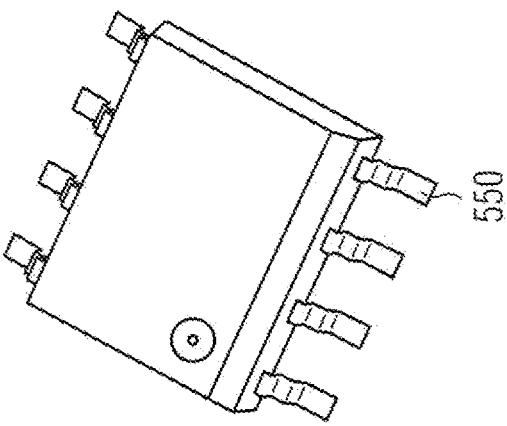

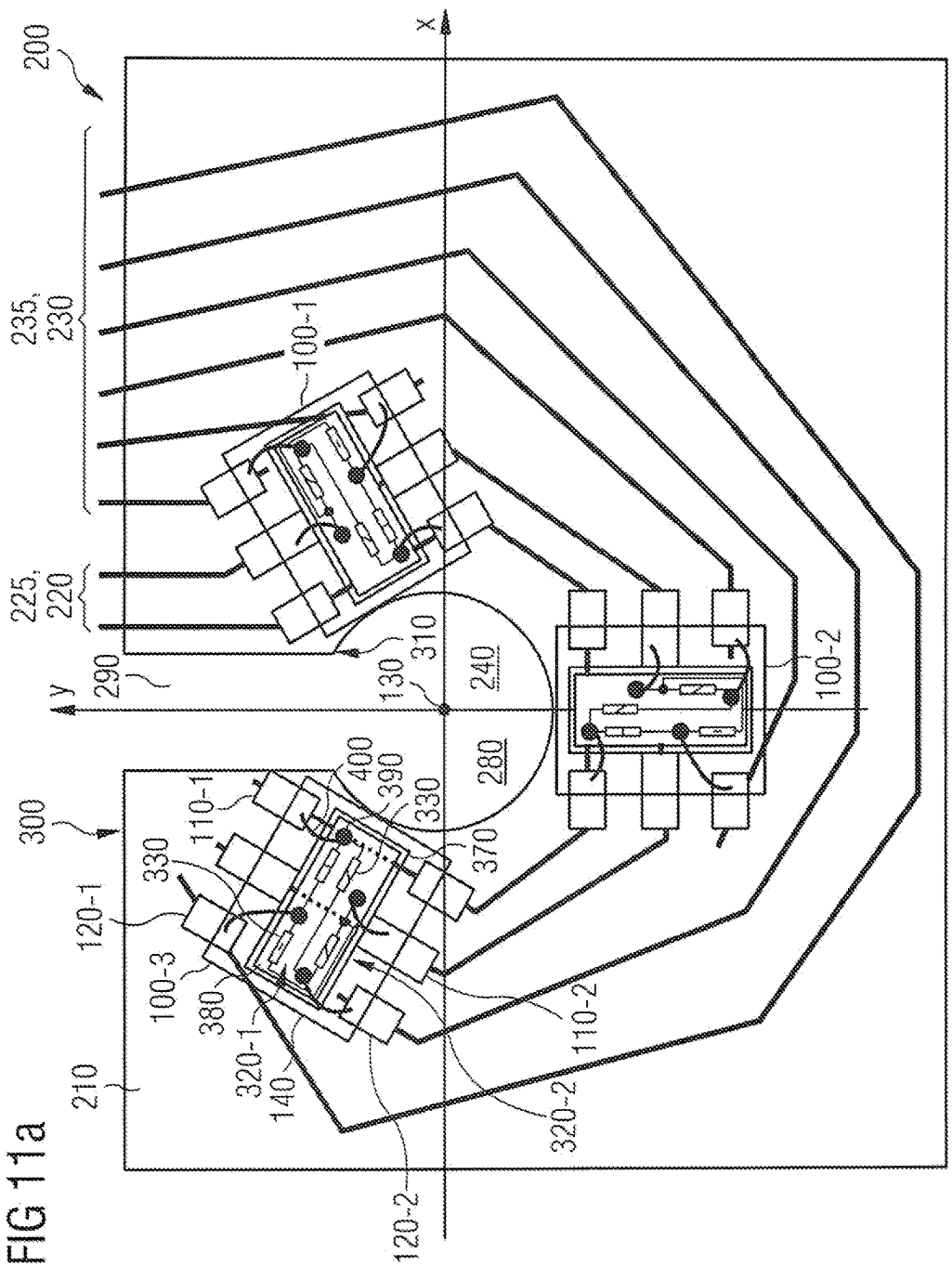

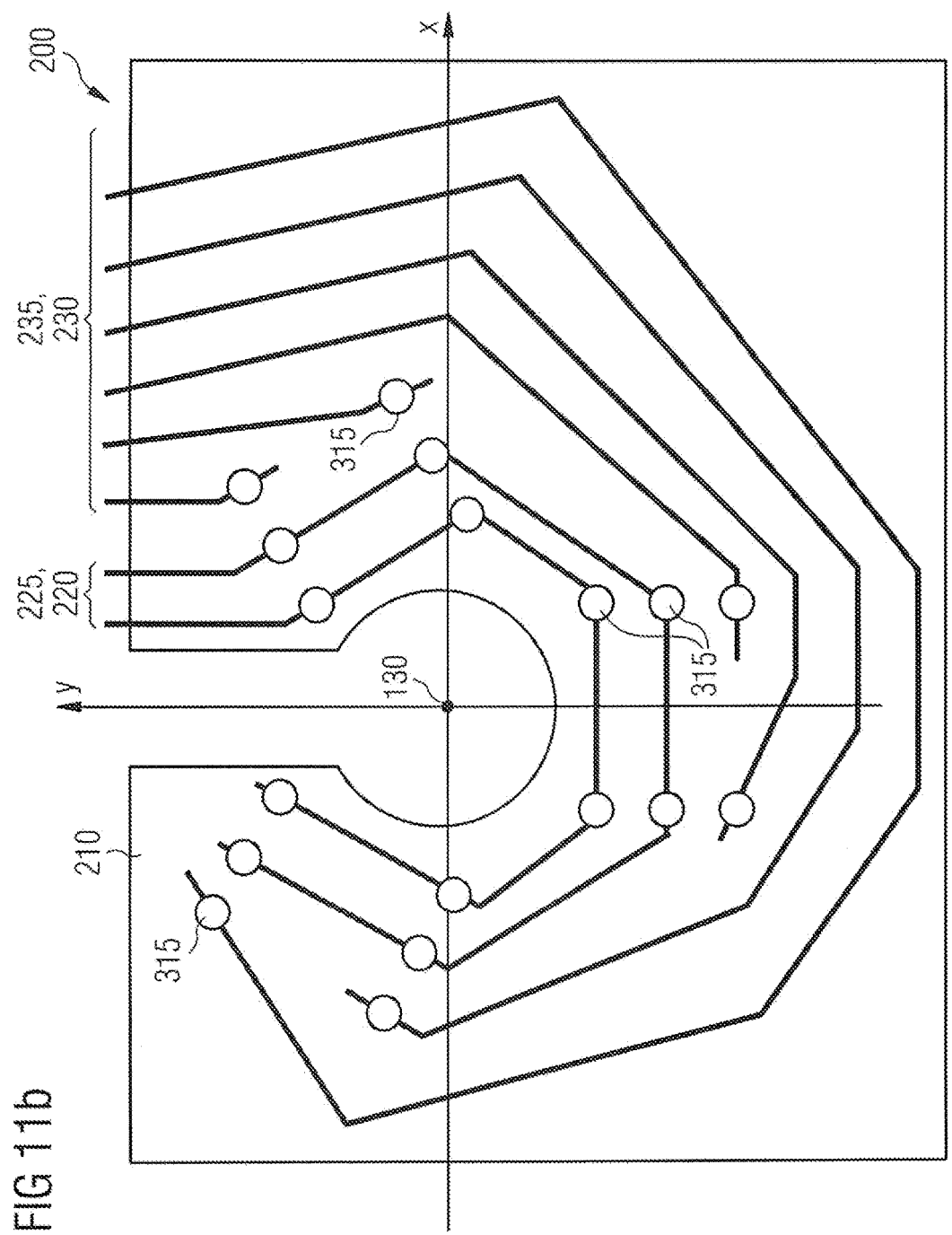

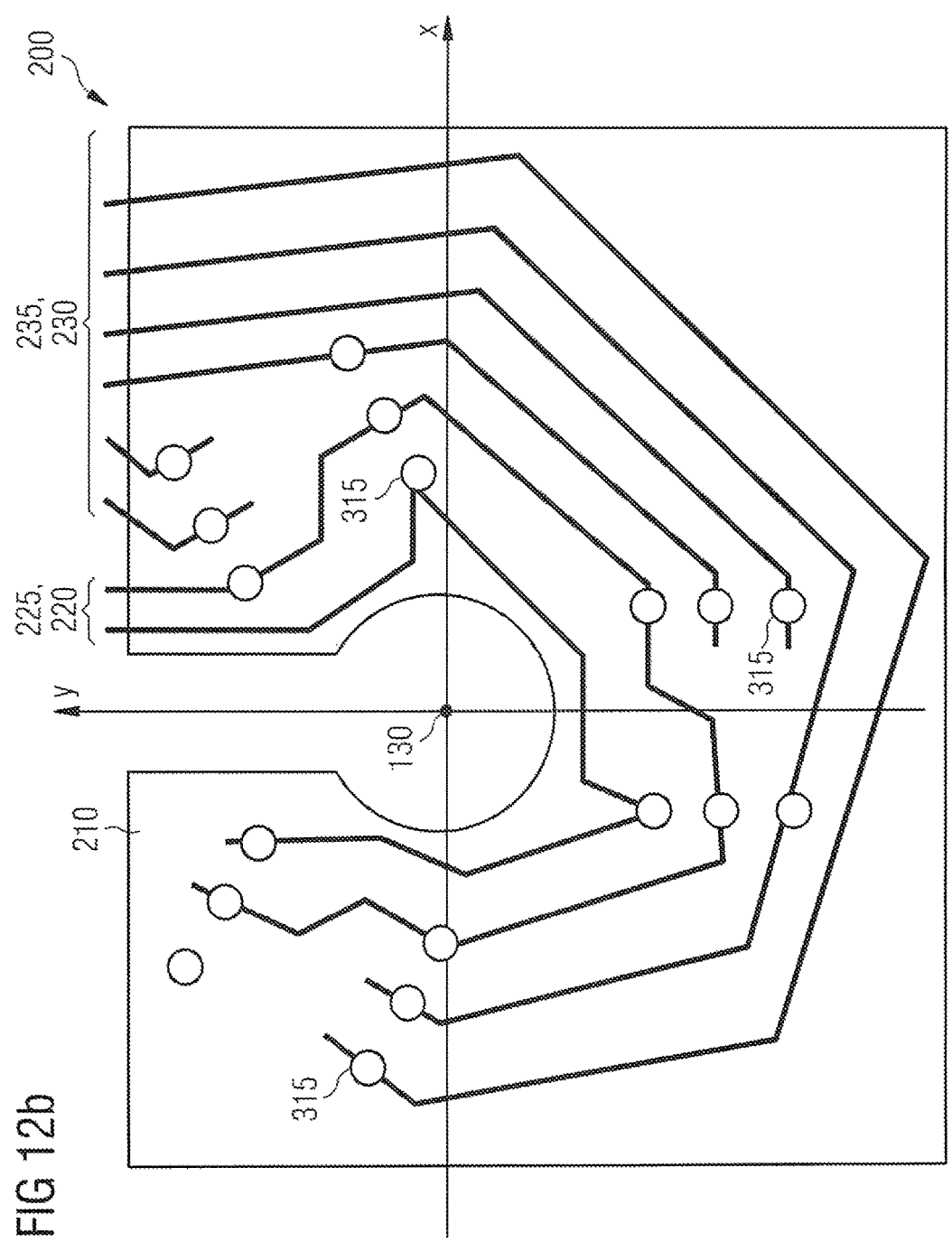

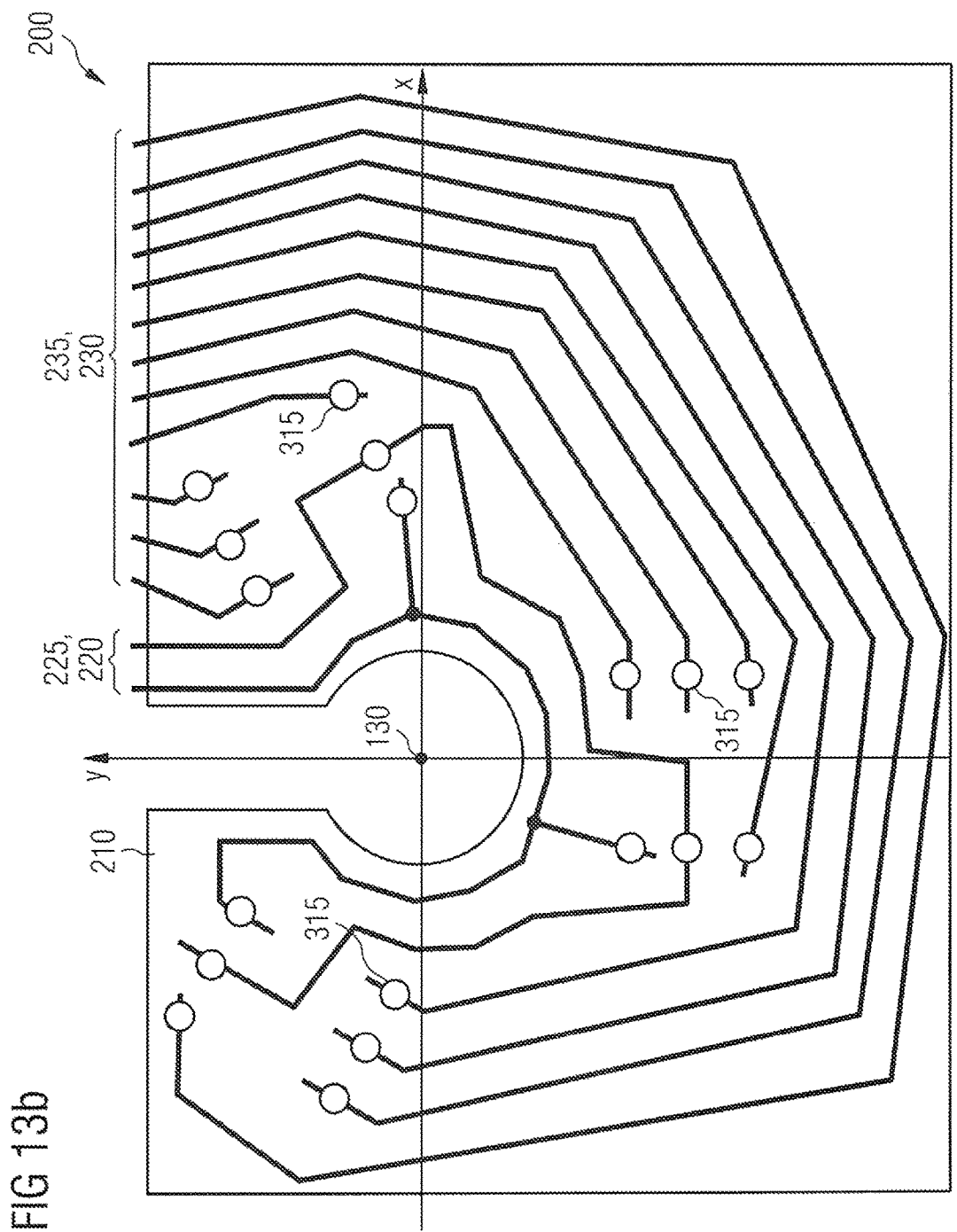

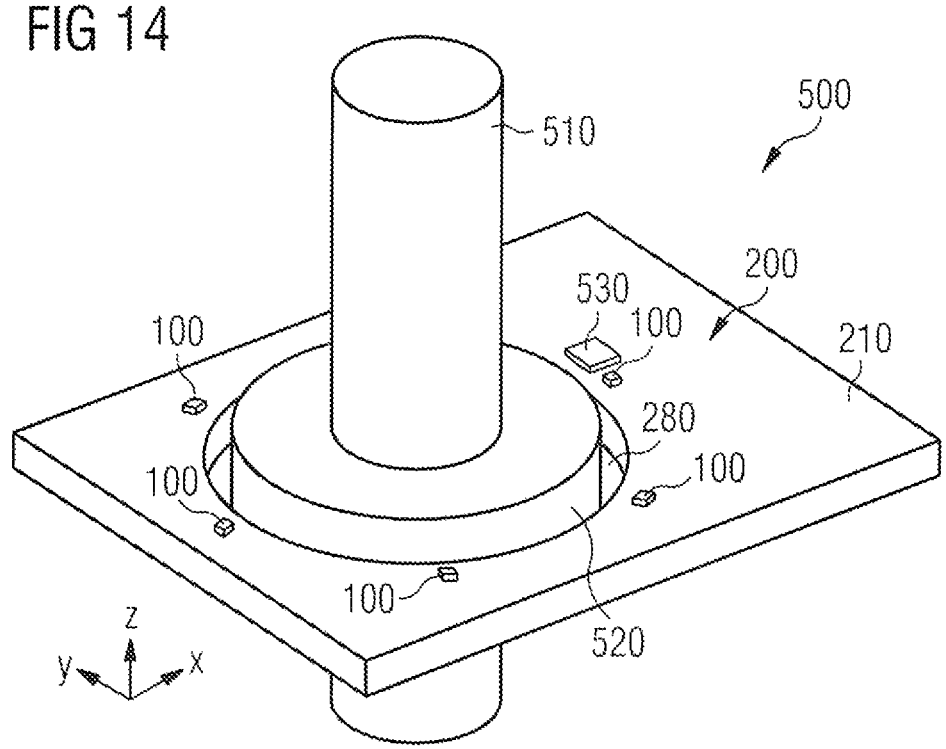
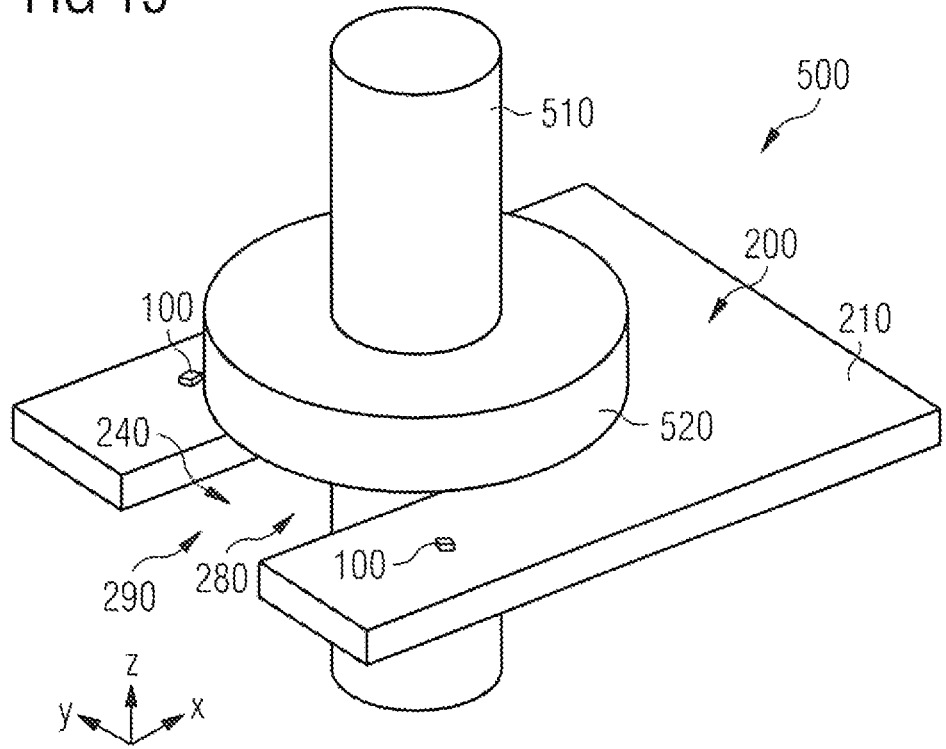

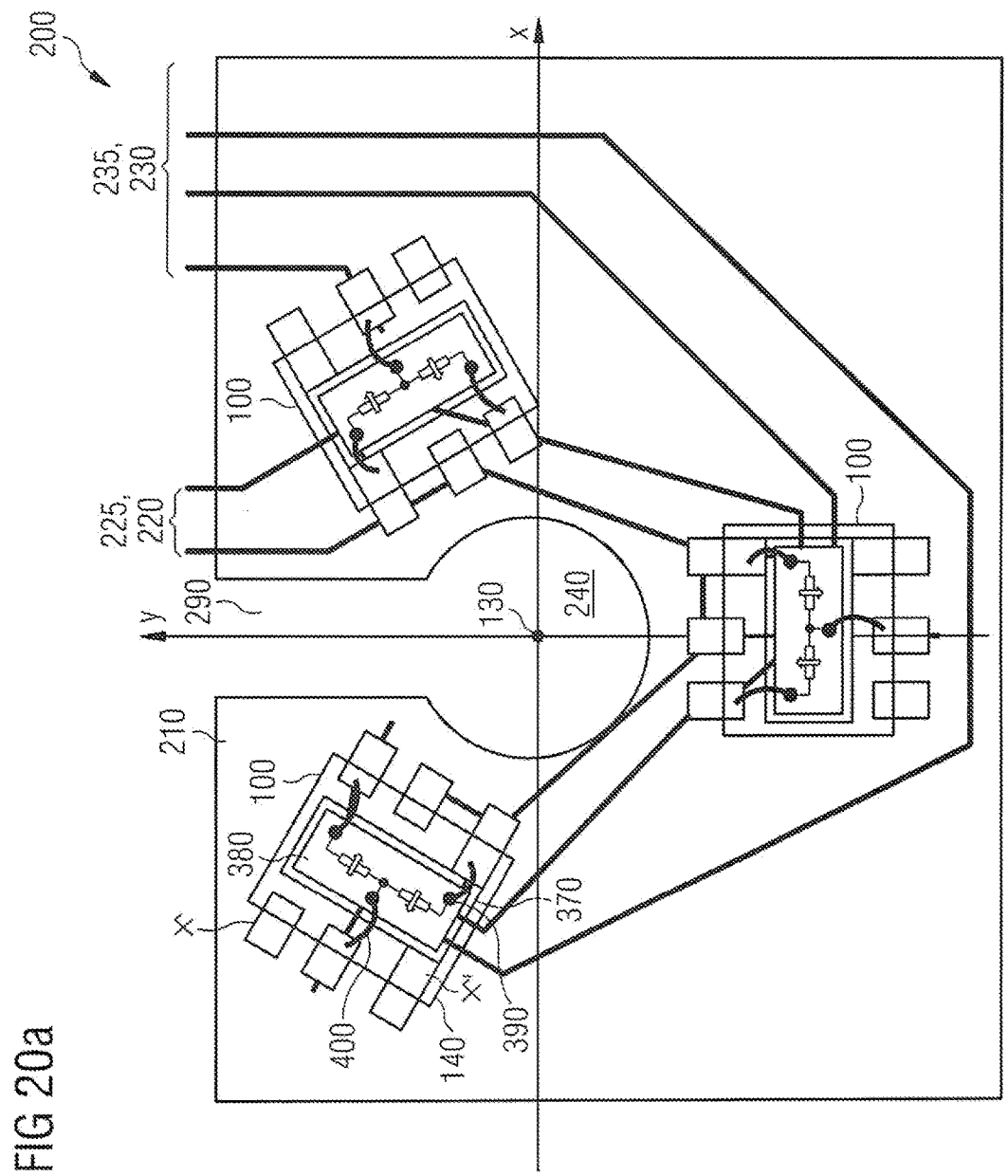

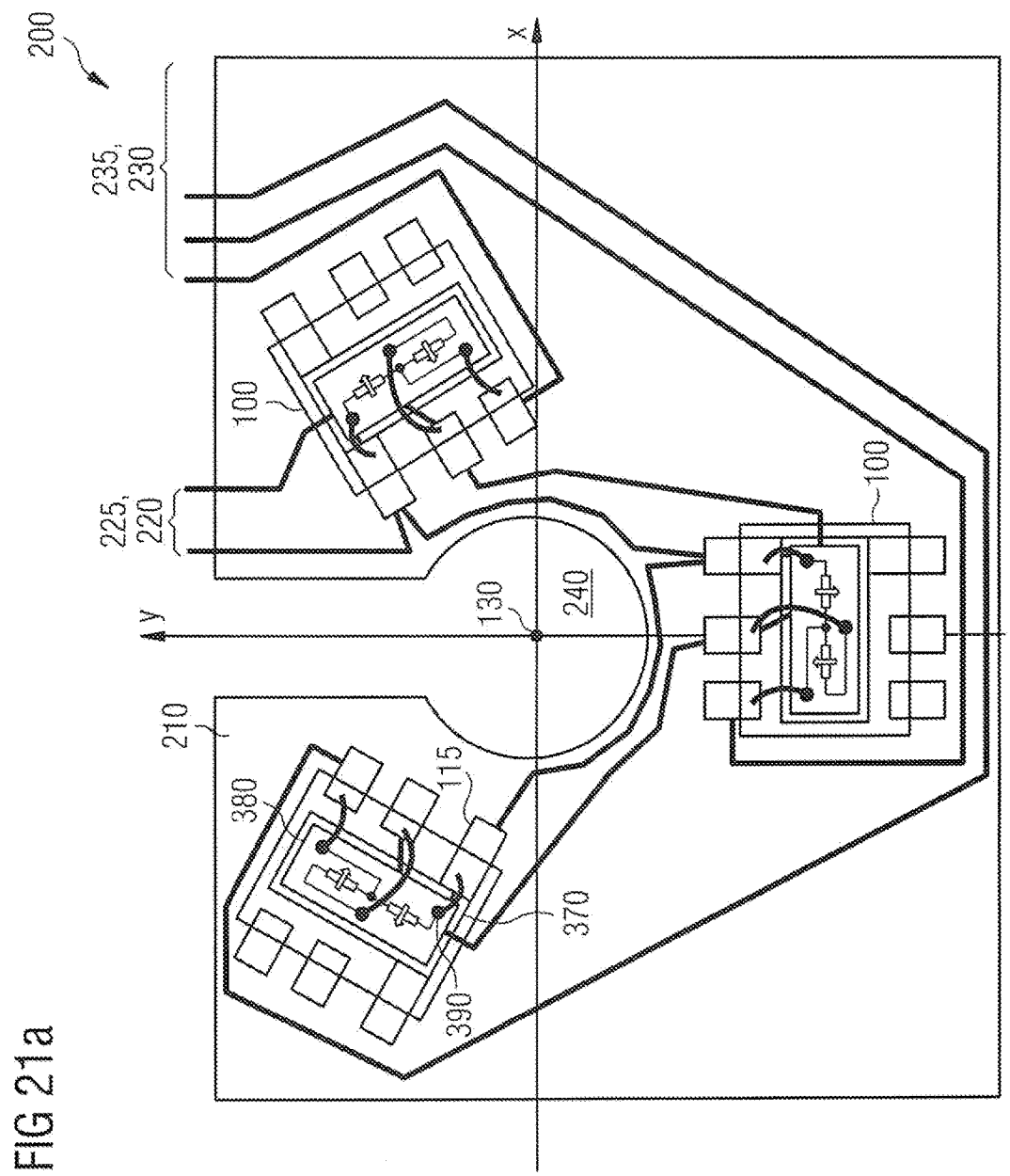

SENSOR DEVICE AND SENSOR ARRANGEMENT

TECHNICAL FIELD

Embodiments relate to a sensor device and a sensor arrangement.

BACKGROUND

In many applications, systems, components and devices have to be designed in view of partially contradicting goals and aspects. Among those are, for instance, technical feasibility, accuracy, reliability, efficiency, producibility and more economically oriented aspects including, for instance, production and/or operation costs. These and further aspects may have to be considered and balanced out when designing a specific device, a component for a larger system or a whole system.

Examples come from all fields of technology where, for instance, sensors are used to detect and monitor environmental parameters, operational parameters and other physical, chemical or biological quantities. The previously-mentioned goals and aspects are typically considered on all levels of designing a complex system. In other words, not only on the system-level, but also on a component- and device-based level, partially contradicting goals and aspects will have to be considered. Moreover, between the different levels, typically an interchange exists. The less effort on one level is spent, the more attention has to be typically paid to details on other levels.

For instance, in the component of a system comprising one or more devices, simplifying the properties and features of the device may lead to a more complicated implementation of the devices into the component.

In the field of sensor-related applications, it may be interesting to implement not just a single sensor device, but a plurality of sensor devices for different reasons, for instance, to enhance an accuracy of the measurement. However, to influence the previously-mentioned goals and aspects, simplifying a sensor device at least to some extent may appear to be a viable option. However, implementing such a sensor device may become more difficult and influence the previously-mentioned goals and aspects of the component itself or other parts thereof. For instance, the electrical connections to supply the individual sensor devices with electrical energy and to allow information carrying signals to be at least in one direction sent may become more difficult.

SUMMARY

Therefore, a demand exists to provide a sensor arrangement and a sensor device allowing an easier implementation.

A sensor arrangement according to an embodiment comprises a board comprising a plurality of conductive lines of a first type, a plurality of conductive lines of a second type different from the conductive lines of the first type, and a recess. It further comprises a plurality of sensor devices mechanically accommodated on a main surface of the board and arranged around the recess, each sensor device being electrically coupled to the conductive lines of the first type and at least to one of the conductive lines of the second type, wherein each conductive line of the second type electrically couples a sensor device with at least one other item different from the sensor devices of the plurality of sensor devices, wherein a projection of the conductive lines of the first and second types perpendicular to the main surface is crossing-free, and wherein each conductive line of the first type electrically couples at least all of the plurality of sensor devices.

A sensor device according to an embodiment comprises a magnetic field sensitive element comprising at least two electrical supply terminals and at least one output terminal, wherein the device is subdividable by an intersecting plane into a first portion and a second portion such that the centroids of all of the contact areas of the electrical supply terminals are arranged in the second portion.

BRIEF DESCRIPTION OF THE DRAWINGS

Several embodiments of the present invention will be described in the enclosed Figures.

FIG. 1 shows a schematic overview of a sensor device according to an embodiment;

FIG. 2 shows a simplified block diagram of a sensor arrangement according to an embodiment;

FIG. 9 shows a simplified block diagram of a sensor device comprising two full-bridge circuits;

FIG. 10b shows the schematic plan view of FIG. 10a without the three SMD sensor devices;

FIG. 10c shows a perspective view of a SMD-package of sensor device with leads according to an embodiment;

FIG. 10d shows a perspective view of a SMD-package of sensor device with leads according to an embodiment;

FIG. 10e shows a perspective view of a SMD-package of sensor device with lands according to an embodiment;

FIG. 11a shows a schematic plan view of a sensor arrangement according to an embodiment comprising three SMD sensor devices, each accommodating two half-bridge circuits of AMR sensor elements;

FIG. 11b shows the schematic plan view of FIG. 11a without the three SMD sensor devices;

FIG. 12b shows the schematic plan view of FIG. 12a without the three SMD sensor devices;

FIG. 13b shows the schematic plan view of FIG. 13a without the three SMD sensor devices;

FIG. 14 shows a perspective view of a sensor system comprising a sensor arrangement according to an embodiment;

FIG. 15 shows a perspective view of a further sensor system comprising a sensor arrangement according to an embodiment;

FIG. 19b shows a simplified layout of a sensor device according to an embodiment, which may be used in the sensor arrangement of FIG. 19a;

FIG. 20a shows a simplified plan view of a sensor arrangement according to an embodiment;

FIG. 21a shows a simplified diagram of a sensor device according to a further embodiment.

DETAILED DESCRIPTION

Figure 3:
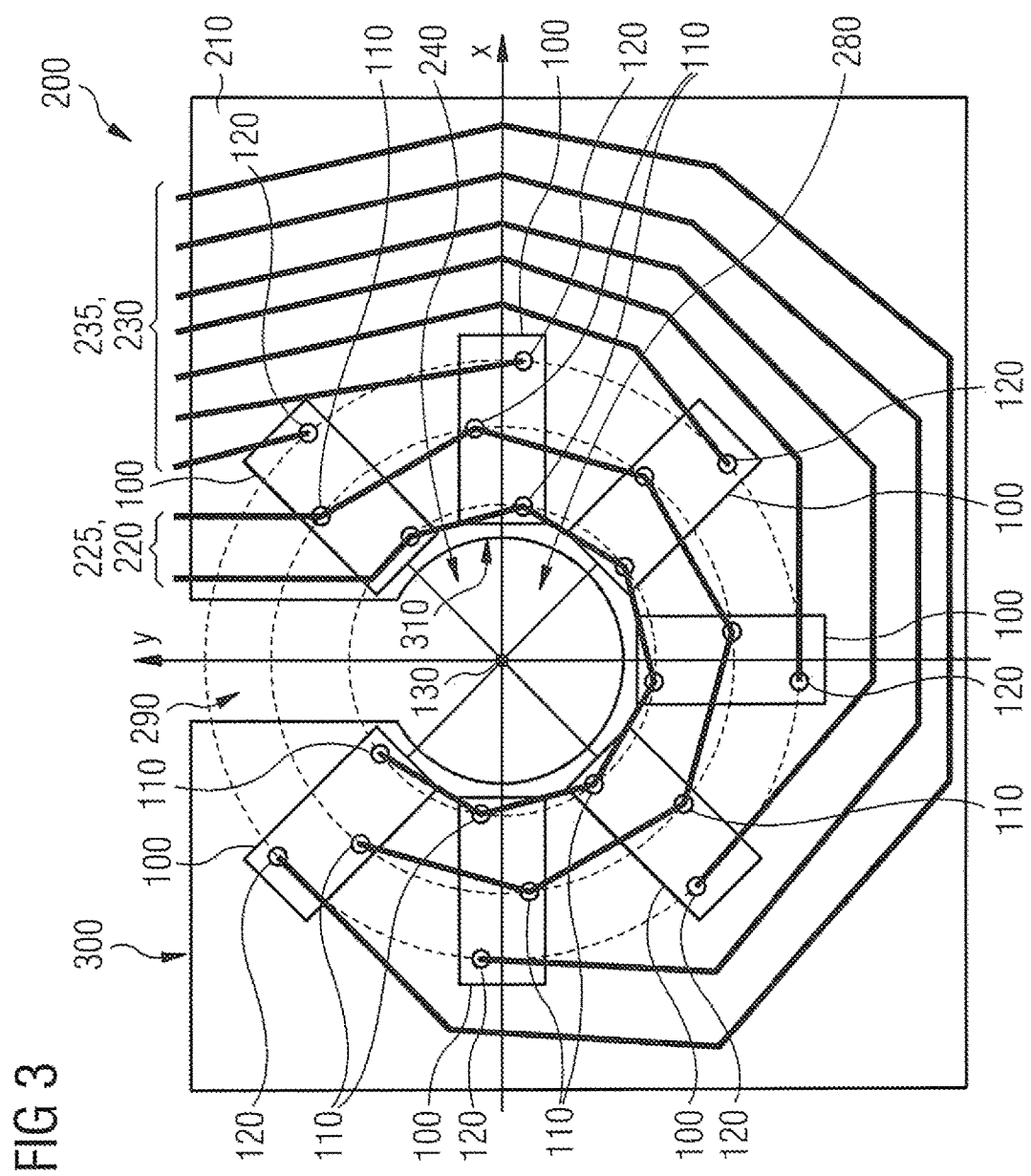
FIG. 3 shows a schematic block diagram of a sensor arrangement according to an embodiment.

In the following, embodiments according to the present invention will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

As will be laid out in more detail below, a practical relevance of an embodiment may be a cost-efficient sensor system, which uses several chips arranged around a center. In order to achieve low over-all costs, it may be advisable to implement chips being comparably cheap. This, however, may mean that it may be advisable to use chips or devices having no active electronic devices like transistors, but only comparably simple magneto-resistors or similar sensor elements. As a consequence, the chips might not comprise a typical number of, for instance, about 20 levels or layers of a CMOS/BiCMOS (CMOS=complementary metal oxide semiconductor; BiCMOS=Bipolar CMOS) semiconductor structure, but only a few levels/layers needed to be patterned and contacted to provide sensor elements such as magneto-resistors.

However, embodiments are by far not limited to low-cost systems or systems comprising only low-complexity devices or systems employing magnetic sensor elements. Embodiments may come from all areas of technology. Only to keep the following description brief and concise, the main focus will be laid on magnetic sensor applications and magneto-resistive sensor elements.

FIG. 1 shows a schematic overview of a device 100 according to an embodiment. The device 100 comprises at least two supply terminals 110-1, 110-2 to provide the device 100 with a electrical energy to operate the device 100. Via the supply terminals 110 the device 100 can be supplied with electrical energy by providing, for instance, a negative supply voltage and a positive supply voltage to the supply terminals 110-1, 110-2, respectively, or vice-versa. In the following description, the first supply terminal 110-1 will be considered the one to provide the negative supply voltage, while the second supply terminal 110-2 will be the one for the positive supply voltage. Naturally, the polarity of the supply voltages may be reversed or switched with respect to the terminals. Therefore, the supply terminals 110 may be designed to couple electrical energy at two different electrical potentials to the sensor device 100.

The supply terminals 110 represent examples of terminals of a first type 115, each of which may be electrically coupled to a conductive line coupling, for instance, a plurality of sensor devices 100 or other devices to a common electrical network node. Apart from the previously-mentioned supply terminals, further examples of such a terminal of a first type 115, which is also referred to as a terminal of type A, may, for instance, comprise terminals to be coupled to a common clock line. In other words, terminals of different sensor devices 100 and, optionally, other circuits may be coupled to the same electrical network node. In other words, the corresponding terminals of, for instance, all devices 100 or all sensor devices 100, may be interconnected by a conductive line such as a conductive trace, a conductive track, a corresponding wire or another electrical contact having a negligible electrical resistance compared to other resistive elements of the resulting circuitry.

Correspondingly, the signal lines to which the terminals of the first type 115 may be coupled, may be referred to as conductive lines of a first type. Examples will be described in more detail below. An electrical node may, for instance, comprise an electrical potential which is essentially the same for all terminals of the first type 115 for signals having a sufficiently low frequency such as DC or DC-like signals (DC=direct current). DC-like or signals having a sufficiently low frequency may, for instance, be signals having a frequency corresponding to a wavelength, which is substantially larger than an extension of the corresponding conductive line of the first type. This may enable to provide all terminals coupled to the respective common electrical network node with the same electrical potential essentially simultaneously. In other words, effects caused by a finite propagation velocity may be disregarded in such a situation.

Terminals of the first type 150 may be suitable to be provided with the same electrical potential during operation of the sensor device 100. However, the terminals of the first type may also comprise all terminals necessary to supply the sensor device 100 with energy, a common system master clock, other common system signals for synchronization purpose or any combination thereof.

The device 100 further comprises at least one sensor signal output terminal 120 capable of providing a sensor signal to a further component outside the device 100. The sensor signal output terminal 120 may be used to fulfill further functions and tasks in embodiments of a device 100 than to provide the sensor signal. The sensor signal output terminal 120 may, for instance, also be used to receive other sensor signals from other devices, to provide or to receive other information carrying signals such as control signals, status signals, error signals, command signals to the device 100, from the device 100, or in both directions.

The sensor signal output terminals 120 represent an example of a terminal of a second type 125. Each terminal of the second type 125 may be electrically coupled to a corresponding conductive line electrically coupling the respective sensor device 100 to an item, which is different from the sensor devices 100 or, in other words, none of any devices 100 comprised in a sensor arrangement as described below. Terminals 125 of the second type, which are also referred to as terminals of type B, electrically couple a specific terminal of the device 100 to other items or circuit elements excluding the same or a similar terminal in terms of their functions of one or more other devices 100. Terminals of the second type 125 couple the respective terminal of the sensor device 100 to an electrical network node individual to the specific device 100 in terms of all the other devices 100, when implemented. To this specific network node no other device 100 is directly electrically coupled. However, the terminal of the second type 125 may naturally be coupled to other circuit elements or items to allow obtain or provide, for instance, a signal at the respective terminal of the second type 125. Examples of circuit elements and items comprise connectors, pins, resistors, transistors and other electrical and electronic devices and structures. To put it in different words, by electrically connecting or coupling two or more sensor devices 100 on a common component board such as a printed circuit board (PCB), the respective terminals of the second type 125 of different devices 100 are not coupled to a common electrical network node. For instance, each of the conductive lines of the first type may couple the sensor devices 100 to an electrical network node common to all of the sensor devices 100, while each of the conductive lines of the second type may couple exactly one sensor device 100 to exactly one electrical network node individual to the respective sensor device.

An electrical network node may form, when two electrically conductive structures such as terminals of one or more devices 100, other circuit elements or devices are electrically coupled by an electrically conductive structure such as a conductive line or trace, a wire or a similar wire-like electrical connection. As a consequence, the respective electrical components and, hence, the electrical network node, may share under ideal circumstances the same electrical potential. Depending on the electrical resistances involved, the lengths of the interconnecting electrical connections and other parameters, deviations in a real-life implementation may occur due to resistances, propagation velocities and other effects.

The conductive lines used to electrically couple the terminals of the first type and of the second type are referred to as conductive lines of the first and second type, respectively. Mechanical components may be coupled to one another directly or indirectly via a further component. Electrical and other components can be coupled to one another directly or indirectly in such a way that information carrying or informing comprising signals can be interchanged or sent from one component to the other component. Moreover, electrical and other components can be electrically coupled directly or indirectly to provide them with electrical energy, for instance, by providing a supply voltage and a supply current to the respective components.

Information carrying signals or information comprising signals can be sent, provided or interchanged, for instance, using electrical, optical, magnetic or radio signals. The signals can be in terms of their values and their timely sequence independent from one another be discrete or continuous. For instance, the signals may be analog or digital signals.

The sensor device 100 may be arrangeable such that the supply terminals 110 may be arranged closer to a reference point 130 outside the sensor device 100 than any signal output terminal of the device 100. The reference point 130 may, for instance, lay on a reference direction or reference line of the sensor device 100. Such a reference direction or reference line may, for instance, correspond to a predefined orientation direction for operating the device 100. For instance, the reference direction may correspond to 0°-direction of an external magnetic field. It may, for instance, be determined by a device-internal structure and/or orientation of its sensor elements. However, it may also be the consequence of a device-internal manipulation of data provided by the sensor elements of the device 100. In other words, the reference point 130 may lay on a predefined and/or device-specific measurement direction or measurement line.

As outlined before, depending on the concrete implementation of a sensor device 100, the at least two supply terminals 110 may also be closer to or equally spaced from the reference point 130 than any of at least one of all sensor signal terminals of the sensor device 100 and all signal terminals for information carrying signals of the sensor device 100, for instance, to receive, to send or to interchange control signals, status signals, error signals and/or command signals.

Naturally, the number of terminals may differ from the number of terminals shown in FIG. 1. For instance, the device 100 may comprise more than two supply terminals 110, for instance, three, four or more terminals. Similarly, the number of sensor signal output terminals 120, sensor signal terminals or signals for information carrying signals may also be larger than one. Examples will be shown and described in more detail below. To put it in more general terms, a sensor device 100 according to an embodiment may comprise more terminals of a first type 115 and, alternatively or additionally, more terminals of the second type than shown in FIG. 1.

The supply terminals 110 and the sensor signal output terminals 120 may be arranged and configured in such a way to establish an electrical connection or an electrical coupling to an external board in a common plane. The same may also be true for a device 100 for further terminals such as the previously-mentioned signal terminals and the signal terminals for information carrying signals. In such a case, the reference point 130 may, for instance, be located in the common plane and outside a projection of the sensor device 100 onto the common plane along a direction perpendicular to the common plane.

For instance, the device may be designed to be mountable to such an external board using a flip-chip-technique. In such a case, the device 100 may, for instance, comprise pads which may be metallized and arranged on the surface of a die or a chip of the device 100. Onto the respective pads solder dots may be deposited which can then be used to solder the device 100 onto the external board. For instance, the terminals of the sensor device 100 may be arranged in such a way that in the case of employing the flip-chip-technique a mechanically stable configuration may be achieved allowing the device or chip to rest safely on its terminals. For instance, the terminals may be arranged to prevent the device from toppling or tilting. In other words, the terminals may be arranged in a pattern different from a single straight line.

Naturally, also other mounting techniques may be used. For instance, the device 100 may comprise a housing 140 to form a leaded package or an unleaded SMD package (SMD=Surface Mountable Device). In the case of a leaded package, the corresponding external board may comprise holes through which the leads of the leaded package are put and in which the leads of the housing 140 are soldered. However, in the case of an unleaded SMD package, the housing 140 may comprise lands or other contact pins or terminals allowing the device 100 to be directly soldered onto the external board.

The reference point 130 may, for instance, be arranged in the common plane, in which the at least two supply terminals 110 and the signal output terminals 120 of the sensor device 100 are configured to be electrically coupled to the external board. Moreover, the reference point may be located outside a projection area of the sensor device 100 onto the common plane in a direction perpendicular to the common plane. Moreover, the reference point may also be located outside of a rectangular-shaped area in the common plane completely comprising the previously defined projection area of the device 100.

The sensor device 100 may be implemented as a discrete device. A discrete device may be, for instance, contained within or formed on a single substrate, die or chip. It may also be distributed over several substrates, dies or chips with the substrates being arranged or contained in a single package. For instance, all parts of the discrete device may be manufactured in a single process sequence, such as a semiconductor wafer process to fabricate the discrete device. Sometimes, parts of the sensors may be manufactured after a typical microelectronic wafer manufacturing process. For instance, magnetic flux concentrators may be glued to a top of a wafer, diode chip or magneto-resistors may be sputtered on top of a wafer after the last interconnect layer has been manufactured. In order not to pollute the wafer fabrication these parts may be done immediately after the ordinary wafer process, yet these processing steps may still be closely linked to the wafer fabrication, particularly, if a final passivation layer protecting the circuit and other sensor elements is applied afterwards.

Another possible feature of a discrete device 100 may be that it has undergone a magnetic or other functional test, before it is assembled together into a more complex component. If such a test has been carried out, the individual parts that went through this test may be regarded as discrete devices. For instance, the test may comprise a simplified test procedure allowing verifying if the discrete device works and if its performance is in the expected limits. In other words, the test may be used to see if an additional calibration may be unnecessary, advisable or perhaps even necessary. However, it may be interesting to try to avoid an additional calibration to avoid implementing an additional memory or other storage cells to store the calibration data. This may, for instance, be avoided by using a set of discrete devices having similar properties and/or characteristics within a specified, application-specific margin. For instance, the discrete devices may be coupled to the same power source and/or be fabricated during the same process steps.

The at least two supply terminals 110, the sensor signal output terminals 120—and optionally the further terminals mentioned above—may be arranged in at least one row 150 of terminals. In the case of the sensor device 100 as shown in FIG. 1, the terminals 110, 120 are arranged in two rows 150-1, 150-2. The rows are in this embodiment aligned to point approximately to the reference point 130. Naturally, in other embodiments, the number of rows 150 may be different. For instance, a sensor device 100 may comprise only a single row or three or more rows 150. The rows 150 of terminals may optionally be equally spaced. In such a case as, for instance, depicted in FIG. 1, the supply terminals 110 arranged in the same row 150 of terminals as any other sensor signal output terminal 120 are arranged closer to the reference point 130 than the corresponding sensor signal output terminals 120. In the case of FIG. 1, the supply terminal 110-1 of row 150-2 is closer to the reference point 130 than the sensor signal output terminal 120.

Naturally, the same also applies to more complicated sensor device layouts than the one shown in FIG. 1.

The sensor device 100 may be arrangeable such that the at least two supply terminals 110 are closer to the reference point 130 than any of the at least one sensor output signal terminal 120 of the sensor device 100. The at least two supply terminals 110 and the signal output terminals 120 of the sensor device 100 may be configured to be electrically coupled to an external board in a common plane. In this case, the reference point 130 may be located in the common plane and outside a projection of the sensor device 100 onto the common plane along a direction perpendicular to the common plane.

A sensor device 100 according to an embodiment may comprise at least one sensor element electrically coupled to at least one of the sensor signal output terminals 120 of the sensor device 100. In such a case, the sensor device 100 may comprise a plurality of sensor elements electrically coupled to form at least one half bridge circuit comprising a series connection of at least two sensor elements and a node arranged between the at least two sensor elements, wherein the node is electrically coupled to at least one of the sensor signal output terminals of the sensor device, as will be outlined in more detail below. Additionally or alternatively, the at least one sensor element comprises at least one magnetic field sensor element. In such a case, the at least one magnetic field sensor element may comprise at least one of magneto-resistive sensor element, a Hall sensor element, a vertical Hall sensor element, and a magnetic field effect transistor. The magnetic field sensor element may optionally comprise a magnetically pinned layer.

In a sensor device 100 according to an embodiment, the at least one sensor element may be formed at least partially on or in a die, the die comprising a main surface, wherein the main surface is arranged essentially parallel to a common plane, in which the at least two supply terminals and the signal output terminals of the sensor device are configured to be electrically coupled to an external board. Naturally, a sensor device 100 according to an embodiment may comprise a plurality of sensor signal output terminals 120.

The sensor device 100 may be sub-dividable by an intersecting plane 160 into a first portion 170-1 and a second portion 170-2, such that the centroids 180 (geometrical center points) of the contact areas of all of the terminals of the second type 125 are arranged in the second portion 170-2. Moreover, the centroids 180 of the contact areas of all but at most one of the terminals of the first type 115 may be arranged in the first portion 170-1. To put it differently, in some embodiments, all terminals of the second type (type B terminals) 125, which are or may be necessary to operate the sensor device 100, may be located in the second portion 170-2.

The terminals of the first and second types 115, 125 may be essentially arranged in a common plane as outlined before. The sensor device 100 may comprise in this case a projection onto the common plane of polygonal, rectangular or quadratic shape. Naturally, the sensor device 100 may comprise a sensor element, which may, for instance, comprise a magnetic sensor element. The magnetic sensor element in turn may optionally comprise a magnetically-pinned layer.

For instance, a sensor device 100 may comprise at least two supply terminals 110, which may be designed to couple electrical energy at two different electrical potentials to the sensor device 100, and at least one output signal terminal 120 that provides a sensor output signal. The sensor device 100 may further be configured to be mountable to a component board (not shown in FIG. 1) with a single interconnect layer in such a way that a plurality of sensor devices 100 could be placed symmetrically around a perimeter of a hole in the component board, whereby all positive supply terminals 110 would be connected to a positive supply trace in the single interconnect layer of the component board, all negative supply terminals 110 would be connected to a negative supply trace in the single interconnect layer of the component board, and each output signal terminal 120 would be connected to its dedicated output signal trace in the single interconnect layer of the component board, whereby no two of the supply traces and the signal traces would be shorted. In other words, in a plan-view or in a projection along a direction perpendicular to the common plane mentioned before or a main surface of the die of the sensor device 100, the conductive lines may be crossing-free.

Hence, as an example, all terminals of the first type 115 may be arranged at or on the package of the sensor device 100 such that several packages may be arranged around a hole or a recess in the component board such that the connecting lines coupled to all terminals of the first and second types 115, 125, which are necessary for operating the sensor device 100, can be designed to get close to an outer perimeter of the component board without any of the conductive lines crossing themselves or other conducting lines. To put it in different words, none of the conductive lines of the first type (type A conductive lines) cross conductive lines of the second type (type B conductive lines).

FIG. 2 shows a sensor arrangement 200 comprising a board 210 comprising at least two supply lines 220 and a plurality of signal lines 230 and a recess 240 with a reference point 130. It further comprises a plurality of sensor devices 100 which are mechanically accommodated on the board 210 using the flip-chip technique. To be more exact, the sensor arrangement 200 as shown in FIG. 2 comprises two sensor devices 100-1, 100-2, but other sensor arrangements 200 may naturally comprise more sensor devices 100. Each of the sensor devices 100 is electrically coupled to the at least two supply lines 220 and to at least one signal line 230 to provide a sensor signal to the at least one signal line. The at least two supply lines 220 are arranged radially inside of the plurality of signal lines 230 with respect to the reference point 130.

The sensor devices 100 may, for instance, be implemented as a sensor device 100 depicted and described in the context of FIG. 1. In other words, the sensor devices 100 may comprise at least two supply terminals 110-1, 110-2 and at least one sensor signal output terminal 120. As shown in FIG. 2, the sensor devices 100 may be arrangeable such that the at least two supply terminals 110 may be closer to or equally spaced from the reference point 130 outside the sensor device 100 than any sensor signal output terminal 120 of the sensor device 100.

In the sensor arrangement 200 as shown in FIG. 2, the board 210 comprises a plurality of conductive lines 225 and a plurality of conductive lines of the second type 235. The previously-mentioned supply lines 220 are one example of the conductive lines of the first type 225, each of which couples the sensor devices 100 of the sensor arrangement 200—for instance all sensor devices 100 of the sensor arrangement 200—to one electrical network node common to all of the sensor devices 100. An example of the conductive lines of the second type 235 represent the previously-mentioned signal lines 230, each of which couples exactly one sensor device 100 of the sensor device 200 to exactly one electrical node individual to the respective sensor device 100. In other words, each conductive line of the second type 235 is electrically coupled to exactly one sensor device 100.

Although in the embodiment shown in FIG. 2, only two sensor devices 100 are shown, in other embodiments more than two sensor devices may be implemented. In other words, the plurality of sensor devices 100 may in some embodiments comprise at least three sensor devices 100. In a projection of the conductive lines of the first and second types 225, 235 perpendicular to the main surface of the board, on which the sensor devices 100 are mechanically accommodated, may be crossing-free.

As outlined before, the sensor devices 100 may be arranged around the recess 240 of the (component) board 210, wherein the recess may optionally go through the board 210 in a direction perpendicular to the previously-mentioned main surface. The recess 240 may comprise a regular-shaped hole comprising a center point, which may coincide with a reference point 130. The regular shape may be a circular shape, an elliptical shape or a polygonal shape.

In the example shown in FIG. 2, the sensor devices 100 may be oriented towards the reference point 130 such that by rotating the sensor arrangement 100 around the reference point 130 by an angle equal to an angle between two sensor devices 100 with respect to the reference point 130, an orientation of at least one of the sensor devices 100 becomes identical to that of at least one of the two sensor devices 100 previously mentioned. To illustrate this in more detail, the terminals 110-1, 110-2, 120 are arranged in the example shown in FIG. 2 on three concentric circles 250-1, 250-2, 250-3, respectively, all having as a center point or midpoint the reference point 130 and, hence, the center point of the recess 240. For instance, by rotating the sensor arrangement 200 by 180°, the sensor devices 100-1, 100-2 swap or exchange their positions and orientations.

In other words, the sensor devices 100 each comprise a predefined, device-specific orientation direction 260. The sensor devices 100 are oriented with respect to the center point (reference point 130) such that the orientation direction 260 points towards the center point or reference point 130. The sensor devices 100 may be oriented towards the center point (reference point 130) such that by rotating the sensor arrangement 200 around the center point by an angle equal to an angle between two of the sensor devices 100 with respect to the center point, an orientation of at least one of the sensor devices 100 becomes identical to that of the other one of the at least two sensor devices forming the plurality of sensor devices 100.

The conductive lines of the first type 225 may be essentially arranged radially inside of the conducting lines of the second type 235 with respect to the recess 240. Based on the center point or reference point 130, the conductive lines of the first type 225 may be arranged closer to the center point than the conductive lines of the second type 235 with respect to a predefined cross-sectional plane perpendicular to the main surface of the board 210 and comprising a center axis being perpendicular to the main surface of the board 210 and comprising the center point or reference point 130. For instance, the conductive lines of a first type 225 may be arranged radially inside of the conductive lines of the second type 235 with respect to at least 75% of all angles, along which at least one conductive line of the first type 225 and at least one conductive line of the second type 235 are arranged. In other embodiments, the previously-mentioned ratio of 75% may be higher, for instance, comprising, for instance, 85% or even 90%. In other embodiments the ratio may go up as high as 100% such that with respect to angles in a direction of which at least one conductive line of the first type 125 and at least one conductive line of the second type 235 are arranged, the conductive lines of the first type 225 are always closer to the center point than the conductive lines of the second type 235.

Moreover, the sensor devices 100 are identical in the embodiment shown in FIG. 2. This may, for instance, simplify integration and manufacturing of the sensor arrangement 200.

However, in other embodiments, the sensor devices 100 are not required to be identical. For instance, the sensor devices 100 each may comprise a predefined orientation direction 260, which are implemented in terms of the sensor arrangement such that the orientation directions 260 of the plurality of sensor devices 100 point toward the reference point 130.

In the case that the plurality of sensor devices 100 is equally spaced around the reference point 130, by "rotating" the sensor device 100 around the center or reference point 130 by the angle between two neighboring devices (or an integer multiple thereof), the positions and orientations of all sensor devices 100 may stay the same. In other words, the sensor devices 100 of the sensor arrangement 200 may be rotation-invariant.

For instance, the at least two supply lines 220 and the plurality of signal lines 230 may comprise traces arranged in a single conductive layer of the board 210. The conductive layer may, for instance, be fabricated from a metallic layer; thus it may also be referred to as metallization or interconnect layer. In some embodiments, all traces of the at least two supply lines 220 and of the plurality of signal lines may be arranged in the single conductive layer of the board 210. Boards with single conductive layer may be cheaper and more robust than multi-layer boards. It may therefore be possible to implement the at least two supply lines 220 and the plurality of signal lines 230 cross-over-free. However, by implementing connectors, jumpers or the like, also non-cross-over-free implementations may be used at increased production costs and reduced reliability.

In other words, the conductive lines of the first type 225 and the conductive lines of the second type 235 may comprise traces arranged in a single conductive layer of the board 210. In some embodiments, all traces of the conductive lines of the first and second types 225, 235 may be arranged in a single conductive layer of the board 210. The board 210 may, for instance, comprise exactly a single conductive layer.

As will be laid out in more detail below, the recess 240 may further comprise an aperture connecting an outer perimeter of the board 210 and the hole previously mentioned. Such an example is, for instance, shown in FIG. 3.

A sensor device 100 according to an embodiment may enable an easier implementation of such a sensor device 100 into a more complex system or component such as a sensor arrangement 200 according to an embodiment. In the situation depicted in FIG. 2, it is possible by orienting the sensor devices 100 in such a way that the supply terminals 110 are placed radially inwards with respect to the sensor signal output terminal 120 to electrically connect or couple the supply lines 220 to the supply terminals 110 and one of the signal lines 230 to one of the sensor signal output terminals 120. Here, the lines 220, 230 are arranged over the whole angle range in the previously-described manner. However, in different embodiments, it may be possible that due to implementing the connector another circuit element or circuit-related element that the radially inward arrangement of the supply lines 220 with respect to the signal lines 230 may only be valid inside an angular sector 270 comprising the plurality of sensor devices 100.

As depicted in FIG. 2, the sensor devices 100 are arranged around the recess 240, which has the shape of the circular hole with the reference point 130 being the center point or midpoint of the hole. In other words, the reference point 130 may coincide with a center point of the hole 280 or, in more general terms, coincide with a special point of the recess 240. For instance, the sensor devices may be arranged on the component board 210 equidistantly with respect to the reference point 130. However, the reference point 130 may be arranged inside the recess 240. It is to be noted that in many embodiments the recess 240 is not arranged in such a way that the sensor devices cover the recess 240 or the hole 280. In other words, the recess 240 is typically not designed to give a medium such as a gas, a liquid or another medium access to any of the sensor devices. The recess 240 may be designed to accommodate a cylindrical structure, for instance, a rotatable or movable magnet, a rotatable or movable shaft or a current carrying wire.

A sensor device 100 according to an embodiment may, hence, comprise at least two supply terminals 110, which are designed to couple electrical energy at two different electrical potentials to the sensor device 100, and at least one output signal terminal 120 that provides a sensor output signal. The sensor device 100 may further be configured to be mountable to a component board 210 with a single interconnect layer in such a way that a plurality of sensor devices 100 would be placed symmetrically around a perimeter of a hole 280 or a recess 240 in the component board 210, whereby all positive supply terminals 110 would be connected to a positive supply trace in the single interconnect layer of the component board 210, all negative supply terminals 110 would be connected to a negative supply trace in the single interconnect layer of the component board 210, and each output signal terminal 120 would be connected to its dedicated output signal trace in the single interconnect layer of the component board 210, whereby no two of the supply traces and the signal traces would be shorted.

A sensor arrangement 200 according to an embodiment may comprise a board 210 comprising at least two supply lines 220, a plurality of signal lines 230 and a recess 240 with a reference point 130 or center point. It may further comprise a plurality of sensor devices 100 mechanically accommodated on the board 210, each sensor device 100 being electrically coupled to the at least two supply lines 220 and to at least one signal line 230 to provide a sensor signal to the at least one signal line 230, wherein the at least two supply lines 220 are arranged radially inside of the plurality of signal lines 230 with respect to the reference point 130 or the center point. Optionally, in a sensor arrangement 200 the at least two supply lines 220 and the plurality of signal lines 230 may comprise traces arranged in a single conductive layer of the board 210. In some cases, even all traces of the at least two supply lines 220 and of the plurality of signal lines 240 may be arranged in the single conductive layer of the board 210.

In a sensor arrangement 200, the plurality of sensor devices 100 may be arranged around the recess 240 in the board 210. Optionally, the recess 240 may comprises a hole 280 comprising the reference point 130 and an aperture 290 connecting an outer perimeter 300 of the board 210 and the hole 280.

Optionally, the sensor devices 100 may each comprise a predefined orientation direction 260, wherein the plurality of sensor devices 100 may then be oriented with respect to the reference point 130 such that the predefined orientation direction 260 points toward the reference point 130. The sensor devices may further be oriented towards the reference point 130 such that by rotating the sensor arrangement 200 around the reference point 130 by an angle equal to an angle between two sensor devices 100 with respect to the reference point 130, an orientation of at least one of the two sensor devices 100 becomes identical to the at least other one of the two sensor devices 100. Optionally, the sensor devices 100 may be identical.

For instance, a sensor arrangement 200 according to an embodiment may comprise a board 210 comprising at least two supply lines 220, at least three signal lines 230 and a hole 280 with a reference point 130. It may further comprise at least three sensor devices 100 mechanically accommodated on the board 210 and oriented towards the reference point 130, each sensor device 100 being electrically coupled to the at least two supply lines 220 by at least two supply terminals 110 of the sensor device 100 and to at least one signal line 230 by at least one sensor signal output terminal 230 to provide a sensor signal to the at least one signal line 230. The sensor signal may be indicative of a magnetic field acting on the sensor device 100, wherein the at least two supply lines 220 are arranged radially inside of the plurality of signal lines 230 with respect to the reference point 130. The at least two supply terminals 120 may be closer to or equally spaced from the reference point 130 then any sensor signal output terminals 120 of the sensor device 100.

FIG. 3 shows a further block diagram of a sensor arrangement 200 according to an embodiment in the form of a plan view of its component board 210. It shows a plurality of sensor devices 100, which are also referred to as sensor chips, arranged around a reference point 130 and mounted in a flip-chip style or technique to a component board 210. The component board 210 comprises a recess 240 comprising a hole around a center point, which is identical to the reference point 130. For instance, the sensor devices 100 or their chips and/or packages may be arranged in the case of a rectangular shape such that their longer sides are approximately oriented radially with respect to the center point 130. As a consequence, the shorter sides of the sensor devices 100 may in this case be oriented approximately circumferentially. As a consequence, it may be possible to place more sensor devices 100 around the perimeter of the recess 240 or to reduce a diameter of a circle 250 on which the sensor devices 100 are arranged.

As will be laid out in more detail below, when the arrangement 200 is part of a magnetic current sensor, a conductor may go through the hole 280 perpendicularly to the board 210 and the current through this conductor can be measured by the magnetic sensor chips 100 via its associated magnetic field, provided the current is strong enough to create a magnetic field detectable by the sensor chips 100. In case the arrangement 200 is part of an off-axis magnetic angle sensor, a shaft may go through the hole 280 perpendicularly to the board 210 with a permanent magnet attached to the shaft and the angular position of the shaft can be measured by the magnetic sensor chips 100.

Optionally, the component board 210 may also comprise an aperture 290 connecting an outer perimeter 300 of the board 210 and the hole 280 with its reference point 130 so that the arrangement 200 can be installed more easily around the conductor or shaft without the need to pull it over the end of the conductor or shaft.

To provide the sensor chips 100 with their electric supply, the arrangement comprises at least two supply lines 220, whereby all sensor chips 100 of the plurality of sensor chips 100 arranged around the hole 280 may use these supply lines 220 as common supply lines. The sensor chips 100 comprise at least one output terminal 120, where the output signals of the sensor chips 100 can be tapped. A system comprising the arrangement 200 can sample or tap the sensor output signals of at least two sensor chips 100 via the appropriate signal lines 230.

Implementing an embodiment of such an arrangement 200 may be interesting in the case when the sensor chips 100 cannot share common signal lines 230. This may, for instance, be the case, when the sensor chips 100 are based on simple Wheatstone bridge circuits of magneto-resistors, whose output signal is a time-continuous voltage coupled to the sensor signal output terminal 120 of the sensor chip 100. In this case, a common signal line shared by more than one sensor chip 100 might short the bridge circuits of different sensor chips 100 rendering the signals probably useless. Therefore, in such an example, it may be advisable to implement dedicated signal lines 230 for each sensor chip or—in other words—to implement the signal lines 230 such that each signal line 230 is coupled only to one sensor device 100 to provide the sensor signal to the respective signal line 230.

This leads to a plurality of signal lines 230 being implemented, which typically require a lot of space on the component board 210. In cases, when the reference point 130 is located inside the recess 240 or the hole of the component board 210, the recess 240 may severely hamper the wiring of the sensor devices 100. For instance, as will be laid out in more detail below, the recess 240 may be used to accommodate a magnet or a current-carrying wire of a larger system comprising the sensor arrangement 200. However, in applications, it may be desirable to locate the sensor device 100 as close as possible to the reference point since the sensor signals obtainable by the sensor devices 100 may become larger and an overall size of the sensor arrangement may eventually be reducible. A sensor arrangement 200 according to an embodiment may help to overcome these contradictory design goals by providing ring-shaped supply lines around the reference point 130, which may be closer to the recess 240 than the signal lines, which may be significantly larger in number. By using a sensor arrangement 200, a designer may have more space to place the sensor lines 120 or—in more general terms—the conductive lines of the second type 235 outside the conductive lines of a first type 225.

Due to a typical design of such an implementation, space is often available only to a very limited extent between the sensor chips 100 and the reference point 130 due to the hole 280 in the component board 210, it may be more advisable to arrange the signal terminals 120 such that the signal lines 230 can be placed at larger radial distance than the supply lines 220 from the reference point 130. At larger radial distance from the reference point 130 there is often more space available. This may result in the arrangement 200 of terminals 110, 120, supply lines 220 and signal lines 230 as outlined above. Only some of the supply terminals 110 have been marked in FIG. 3 by their reference sign for clarity reasons only.

Naturally, in other embodiments the sensor device 100 or sensor chips 100 may comprise more than just one sensor signal output terminal 120. Hence, in these cases, the sensor devices 100 may comprise a plurality of sensor signal output terminals 120. Naturally, the number of signal lines 230 may be equal to the total number of sensor signal output terminals 120 used by all sensor devices 100 of the arrangement 200.

By using an embodiment, it may be possible to place the sensor chips 100 very close to the reference point 130, since no extra space has to be reserved for conductor traces or lines 220, 230 on the board 210. As a consequence, it may be possible to place the chips 100 right next to an inner perimeter 310 of the recess 240, which may increases the signal strength of the sensor devices 100 due to a more intense interaction between the conductor or shaft or magnet attached to the shaft and the sensor elements of the devices 100 caused by the smaller distance to the reference point 130.

Additionally or alternatively, the component board 210 may only comprise a single layer of conductors, because there crossings may be avoided between conductor traces on the component board 210. Moreover, this arrangement 200 may work for an arbitrary number of sensor chips 100 arranged around the reference point 130, such as N=2, 3, 4, 5, . . . , 20, . . . sensor chips.

The conductor traces on the component board 210 may furthermore have a larger or maximum possible spacing from one another and, thus, the accuracy requirements for the traces may be relaxed compared to conventional implementations. Thus, the board 210 may be produced with simpler and cheaper etching and patterning processes. The allowable thicker traces and the wider pitches between traces may also allow for thicker traces, which might make the system more robust in terms of a higher mechanical strength, less process variations due to coarser structures, and smaller resistances of conductor traces, which may lead to more accurate output signals. Moreover, if the conductor traces have less resistance, it may be possible to reduce the input and output resistances of the sensor circuits or sensor elements on the sensor chips 100 and this may lead to a larger bandwidth of the sensor system.

In a conventional implementation using a multilayer component board, it is simple to avoid crossings of conductor traces in individual layers. However, the board is typically more complex and, hence, more expensive to fabricate. Alternatively, one could use a digital communication protocol to communicate the sensor output signals of all sensor chips on a common signal line. Yet this may require a communication interface on each sensor chip, which adds extra costs per sensor chip. Besides the communication takes extra time and needs to be done in a time-multiplexed way, which may reduce bandwidth and increases signal delay time. By using an embodiment it may, therefore, be possible to enhance the bandwidth, reduce the delay time without significantly adding costs to the individual chips 100.

Figure 4:
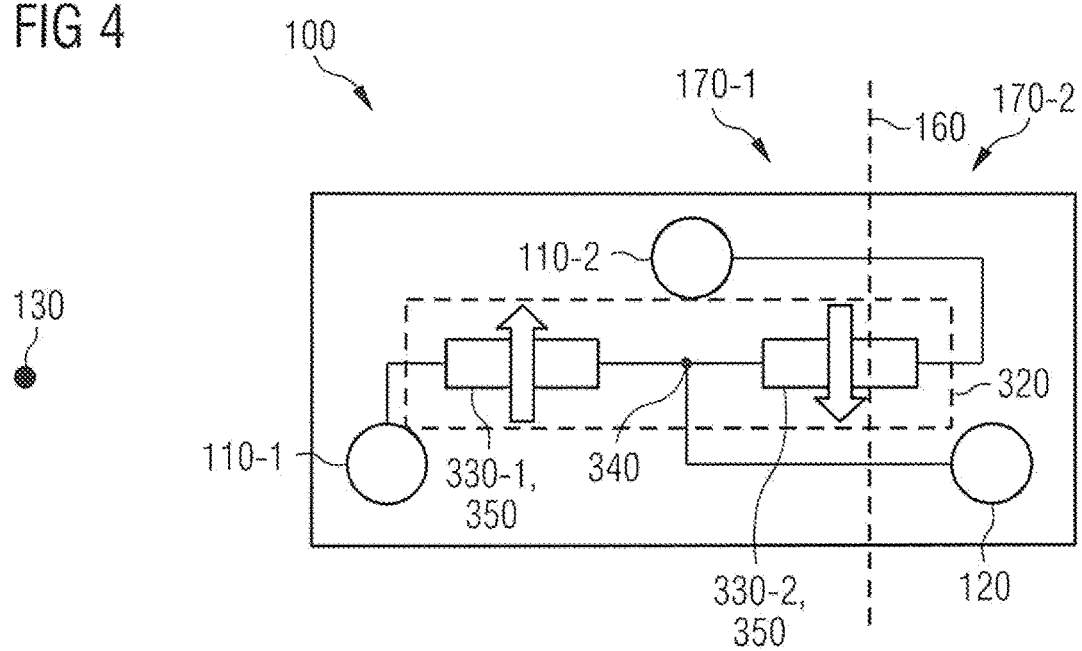
FIG. 4 shows a simplified block diagram of a sensor device according to an embodiment.

FIG. 4 shows a simplified block diagram of a sensor device 100 according to an embodiment, which may, for instance, be used in the arrangement shown in FIG. 2 in more detail. The emphasis of FIG. 4 lies on the positions of the sensor terminals 110, 120 of the sensor chip 100. The sensor chip 100 comprises a half-bridge circuit 320 comprising two sensor elements 330-1, 330-2 forming a series connection with a node 340 between the sensor elements 330-1, 330-2. The node 340 is coupled to the sensor signal output terminal 120 of the device 100.

The sensor elements 330 are or comprise magnetic field sensor elements 350, which may, for instance, be magnetoresistors or magneto-resistive sensor elements (XMR-sensor elements), such as anisotropic magneto-resistive (AMR) sensor elements, giant magneto-resistive (GMR) sensor elements, tunneling magneto-resistive (TMR) sensor elements, or colossal magneto-resistive (CMR) sensor elements.

However, the sensor elements 320 shown in FIG. 4 further comprise a magnetically pinned layer, such as GMR, TMR or CMR sensor elements, which are oriented in an antiparallel direction denoted by the arrows in FIG. 4. In other words, they comprise magnetic reference directions enclosing an angle of essentially 180°. As will be shown in more detail below, in the case of AMR sensor elements, the magnetic reference directions of these sensor elements 320 enclose an angle of essentially 90° such that their reference directions are essentially perpendicular to one another. Furthermore, they typically do not comprise a pinned layer. Their reference directions may, for instance, be defined by so-called barber pole structures.

FIG. 4 represents a mixture of layout and circuit schematic. With respect to the layout, the rectangular shape of the chip 100 is shown and the circles or disks denote the size, shape, and positions of contact pads for the terminals 110, 120, which may be implemented as bond-pads or pads, onto which bumps can make contact in a flip-chip assembly. Hence, FIG. 4 shows the positions of the sensor terminals 110, 120 of the device 100.

However, the two resistors illustrating the sensor elements 330 and the interconnect wires typically do not denote the exact shape and positions of the elements, but only their connectivity. In other words, the sensor elements 300 can be place elsewhere on the chip compared to the positions of the sensor elements 330 shown in FIG. 4, but they may be connected to the terminals and between themselves as shown in FIG. 4. The sensor chip 100 comprises a first supply terminal 100-1, for instance, for a negative supply voltage (negative supply terminal 110-1), a second supply terminal 100-2, for instance, for a positive supply voltage (positive supply terminal 110-2), and the sensor signal output terminal 120, also referred to as the output signal terminal, along with the first and second sensor elements 330-1, 330-2, coupled to one another by on-chip interconnect wires.

As shown in FIG. 4, the supply terminals 110 are on the left side and at the center of the device 100. Yet the signal output 120 is at the right side of the device 100. In other words, the supply terminals 110 are closer to the reference point 130 than any of the sensor signal output terminals 120.

For a flip-chip assembly it may also be advisable that the terminals 110, 120 are not all close to a single line to allow a more stable mounting position. Otherwise, the chip 100 might not stand stably on its bumps. Therefore, it may be advisable to arrange the terminals 110, 120 on different horizontal and vertical positions as shown in FIG. 4, where two contacts 110-1, 120 are in left and right lower corners, respectively, and one contact 110-2 is at the top edge of the device 100 or its die.

To be able to place the sensor chip 100 with minimum tilt on the component board 210 (not shown in FIG. 4) in order to detect the proper magnetic field components and to have best sensor accuracy, it may be advisable to place the contact pads 110, 120 close to the corners in order to have maximum spacing between them so that small differences in the height of the bumps may give only small tilts.

Before further devices will be explained in more detail, a half-bridge circuit 320 and a full-bridge circuit will be described in more detail with respect to FIGS. 5 and 6.

Figure 5:
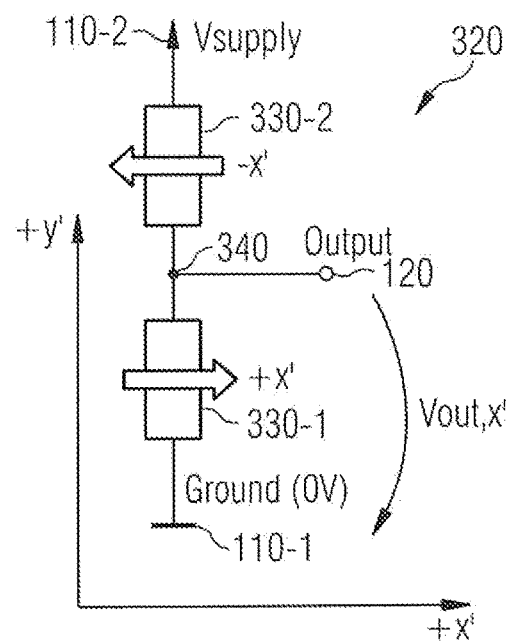
FIG. 5 shows a circuit diagram of a half-bridge circuit.
Figure 6:
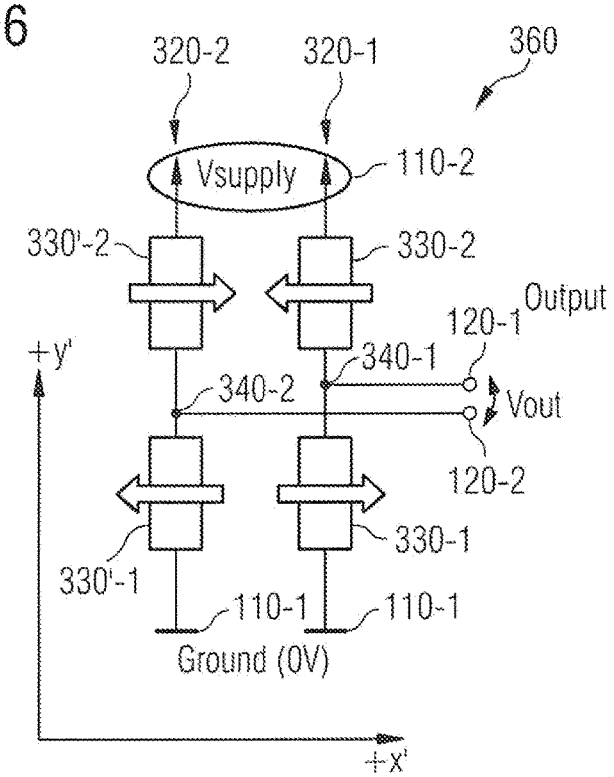
FIG. 6 shows a circuit diagram of a full-bridge circuit.

Embodiments may refer to magneto-resistive sensor elements 320 coupled or connected to one another to form one or more half-bridge circuits 320 as depicted in the circuit diagram of FIG. 5 and a full-bridge circuit 360 as depicted in the circuit diagram of FIG. 6. The half-bridge circuit 320 shown in FIG. 5 comprises two sensor elements 330-1, 330-2, which may, for instance, be implemented as magneto-resistors or magneto-resistive sensor elements with pinned layers. In this case, the top resistor (sensor element 330-2), which is connected between the positive supply terminal 110-2 being supplied with the voltage Vsupply during operation and the output signal terminal 120 ("Output") comprises a reference direction along the negative x'-direction in the layer of the sensor chip. In contrast, the bottom resistor (sensor element 330-1), which is connected between output signal terminal 120 and the negative supply terminal 110-1 ("ground") coupled, for instance, during operation to a reference potential such as ground, comprises a reference direction along the positive x'-direction. As outlined before, the reference direction of the magneto-resistive sensor elements 330 with pinned layers may be defined by the direction of a permanent magnetization of the pinned layer, which may, for instance, be magnetized during the manufacturing of the sensor element.

FIG. 6 shows a circuit diagram of a full-bridge circuit 360 comprising a parallel connection of two half-bridge circuits 320-1, 320-2. The first half-bridge circuit 320-1 is essentially identical to the half-bridge circuit 320 shown in FIG. 5, while the second half-bridge circuit 320-2 comprises magnetizations of the pinned layers of its sensor elements 330', which are anti-parallel to the ones of the first half-bridge circuit 320-1. Therefore, the reference direction of the sensor element 330'-1 of the second half-bridge circuit 320-2 is anti-parallel to the one of sensor element 330-1 of the first half-bridge circuit 320-1. The same is also true for the reference directions of the sensor elements 330'-2 and 330-2 of the two half-bridge circuits 320-2, 320-1, respectively.

Although the supply terminals 110 of the two half-bridge circuits may be electrically coupled as illustrated in FIG. 6, the full-bridge circuit 360 and, hence, the sensor device 100 may comprise a plurality of sensor signal output terminals 120-1, 120-2 of the two half-bridge circuits 320-1, 320-2 coupled to the nodes 340-1, 340-2, respectively.

In other words, by adding a second half-bridge circuit 320-2 essentially identical to the first one 320-1 with the reference directions of positive and negative x' direction being swapped, a combination of both half-bridge circuits 320 is called a full-bridge circuit 360. The output signal of the full-bridge circuit 340 may be tapped between the two output terminals 120-1, 120-2 of the half-bridge circuits 320-1, 320-2, respectively.

Naturally, for instance in the case of magneto-resistive sensor elements, each of the two sensor elements 330 may be split up in a plurality of (magneto-resistive) sensor elements and being connected in series, in parallel or in a combination thereof. Thereby they may have identical reference directions or anti-parallel ones. In the latter case the magnetic sensitivity of the total sum of resistors may be reduced because the two anti-parallel reference directions cancel out.

Instead of +/−x'-directions any other set of two anti-parallel directions may also be used. Often one uses systems with half- or full-bridge circuits having +/−x'-reference directions and half- or full-bridge circuits having +/−y'-reference directions, where x' and y' direction are mutually perpendicular. Examples of magneto-resistive sensor elements with pinned layers are, for instance, GMR (giant MR=giant magneto-resisitve), TMR (tunnelling MR), and CMR (colossal MR), amongst others.

Besides these sensor elements, magneto-resistors without a pinned layer, such as permalloy stripes or AMRs (anisotropic MR) may also be used. The reference directions of AMRs may, for instance, be defined by direction of the current flow through the sensor elements and this may be defined by barber pole stripes on permalloy stripes to name just one example. A half-bridge circuit 320 of AMRs may be similar to the ones described above, yet the reference directions may be perpendicular of the upper and lower resistors 330 instead of being anti-parallel.

Figure 7:
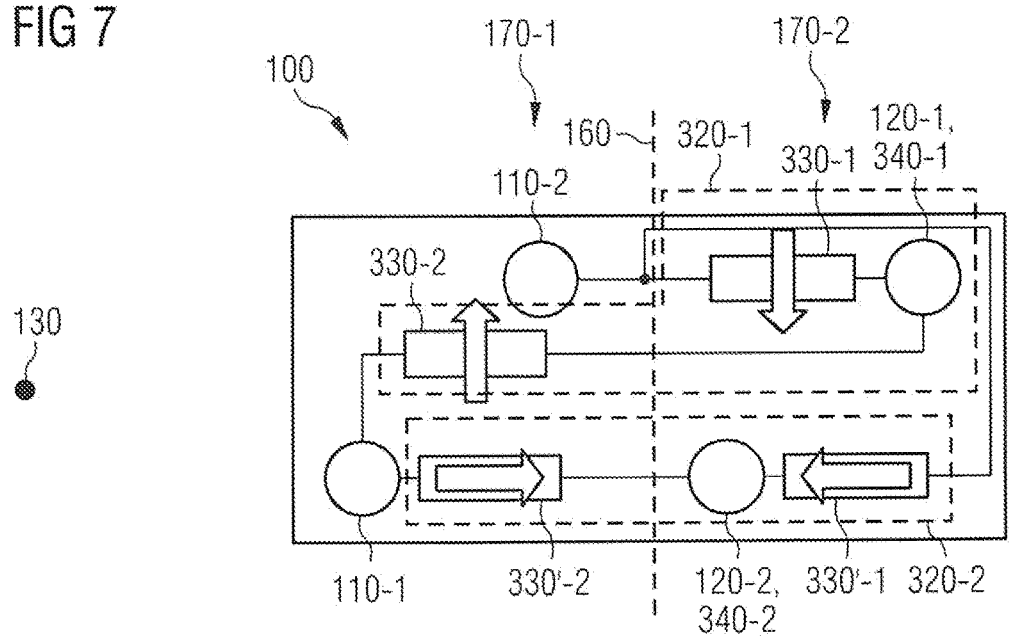
FIG. 7 shows a simplified block diagram of a sensor device according to an embodiment comprising two half-bridge circuits.

In contrast to the sensor chip 100 shown in FIG. 4, FIG. 7 shows a circuit diagram of a sensor chip 100 according to an embodiment comprising two half-bridge circuits 320-1, 320-2 similar to the one shown in FIG. 4. Besides the supply terminals 110-1, 110-2 for the negative supply voltage (negative supply terminal) and for the positive supply voltage (positive supply terminal), the sensor chip 100 comprises two sensor signal output terminals 120-1, 120-2 for the first and second half-bridge circuits 320-1, 320-2, respectively, which also correspond to the nodes 340-1, 340-2 of the two half-bridge circuits 320. Both output signal terminals 120 are arranged further away from the reference point 130 or—in other words—on the right side of the supply terminals 110-1 and 110-2 in FIG. 7. As described before, FIG. 7 illustrates the position of sensor terminals of the two half-bridge circuits 320. Furthermore, FIG. 7 illustrates the on-chip interconnecting wires used to electrically couple the sensor elements 330 to the terminals 110, 120.

The specific arrangement of the terminals 110, 120 of FIG. 7 also enlarges or even maximizes the distances between all neighboring contact pads 110, 120. Larger distances may reduce or minimize the risk of accidental solder bridges, when the chip 100 is soldered to the component board 210 (not shown in FIG. 7). The situation is similar when the sensor chip 100 comprises a full-bridge circuit 360 instead of two half-bridge circuits 320. This situation is shown in FIG. 8.

Figure 8:
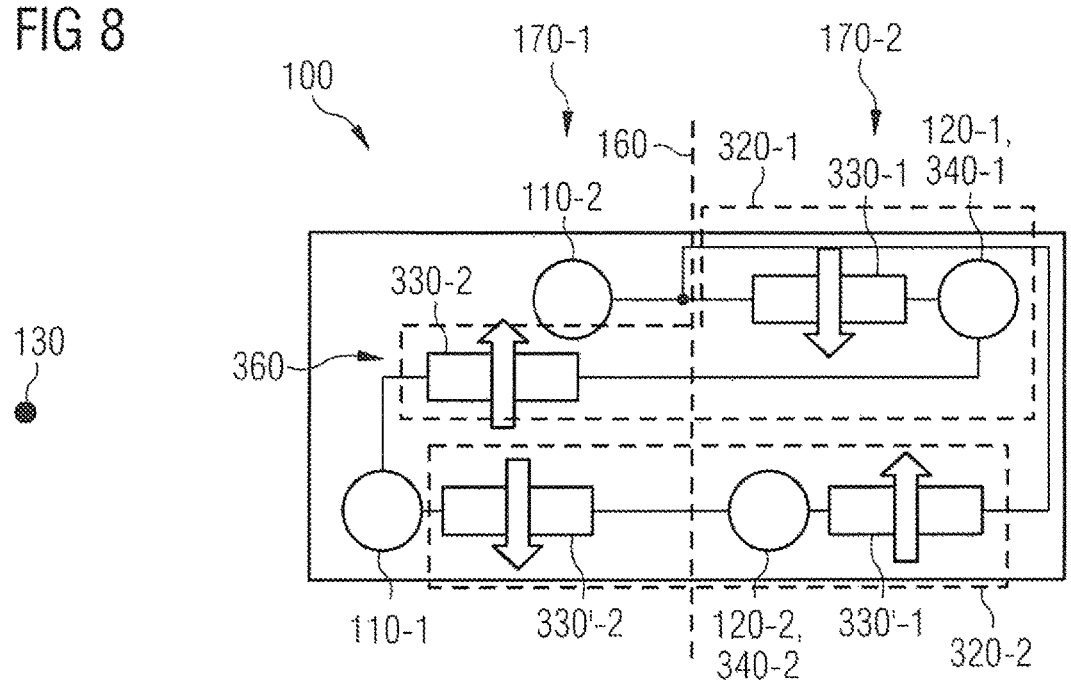
FIG. 8 shows a simplified block diagram of a sensor device comprising a full-bridge circuit.

FIG. 8 shows a simplified block diagram of a sensor chip 100 according to a further embodiment. The sensor chip 100 differs from the one shown in FIG. 7, for instance, with respect to the reference directions of the sensor elements 330. While the sensor elements 330 of the first half-bridge circuit 320-1 and the reference directions of the sensor elements 330' of the second half-bridge circuit 320-2 of the sensor chip 100 of FIG. 7 were essentially oriented perpendicular to one another forming two essentially independent half-bridge circuits 320, reference directions of the sensor elements 330, 330' of the half-bridge circuits 320 of FIG. 8 are essentially parallel and anti-parallel oriented. As a consequence, the two half-bridge circuits 320 may be used as a full-bridge circuit 360. Nevertheless, also FIG. 8 illustrates the positions of the sensor terminals of the full-bridge circuit 360 comprised in the sensor device 100 as well as the on-chip interconnect wires used to electrically couple the sensor elements 330 to the terminals 110, 120.

FIG. 9 shows a simplified block diagram of a sensor chip 100 comprising two full-bridge circuits 360-1, 360-2 illustrating the positions of the sensor terminals 110, 120 of the two full bridge-circuits 360. The sensor chip 100 comprises two supply terminals 110-1 (negative supply terminal) and 110-2 (positive supply terminal) and four sensor signal output terminals 120-1, . . . , 120-4. All four output signal terminals 120 are right of the two supply terminals 110 or—in other words—farther away from the reference point 130.

To be a little more precise, the sensor device 100 shown here comprises four half-bridge circuits 320-1, . . . , 320-4 forming the two full-bridge circuits 360-1, 360-2. The sensor elements 330 of the first and second half-bridge circuits 320-1, 320-2 are parallel or anti-parallel oriented along a horizontal direction shown in FIG. 9. These two half-bridge circuits 320-1, 320-2 form the first full-bridge circuit 360-1 with its first and second output signal terminals 120-1, 120-2. In contrast to the other output signal terminals 120-1, ..., 120-4 of the sensor device 100, the first output signal terminal 120-1 does not simultaneously form or is located at the position of the corresponding node 340-1 of the half-bridge circuit 320-1.

Using on-chip interconnect wires the sensor devices 330 of the first full-bridge circuit 360 are coupled to the already described supply terminals 110-1, 110-2 and the corresponding output signal terminals 120. The same is also true for the second full-bridge circuit 360-2, comprising a third half-bridge circuit 320-3, and a fourth half-bridge circuit 320-4, each comprising a node 340-3, 340-4, respectively, which are located at the positions of the third and fourth output signal terminals 120-3, 120-4, respectively. As shown in FIG. 9, the on-chip interconnect wires also electrically couple the sensor elements 330 to the supply terminals 110 and the respective output signal terminals 120.

Optionally, one or more terminals such as lands may be added, which serve only or mainly the purpose of providing additional mechanical stability. Optionally, their electrical properties may be redundant as, for instance, shown in FIG. 9. In other words, an optional terminal 110-3 may be added or implemented to provide mechanical stability and, optionally, to provide an additional electrical contact for the sensor device 100. The same is also true for terminal 110-4 may be implemented mainly for mechanical stability purposes and, optionally, also to provide an additional electrical contact for the device 100.

Naturally, as indicated by reference sign X, additional terminals, terminal-like structures or stabilizing structures may be implemented, which do not have an electrical contact to the circuitry of the sensor device 100, but are merely implemented to provide additional mechanical stability. The stabilizing structure X may, for instance, be implemented as a land, an additional pin or any other terminal or terminal-like structure which is, however, internally not connected. In other words, the stabilizing structures such as lands, bumps, solder dots, leads or other stabilizing structures may be implemented for stability reasons only, which do not have a galvanic contact inside the circuitry of the sensor device 100. In other words, they are electrically function-free.

FIG. 9 shows an example of a layout of a sensor device 100 having a skewed intersecting plane 160 subdividing the sensor device 100 into two portions 170-1, 170-2 such that the intersecting plane 160 is not parallel to any of the sides of the sensor device 100. In contrast to the situation shown in FIG. 8, the plane 160 intersects the longer sides of the sensor device 100 at an angle different from 90°.

In terms of their reference orientations, the sensor elements 330 of the second full-bridge circuit 360-2 are also oriented parallel and anti-parallel with respect to one another. However, the reference directions of the sensor elements 330 of the two different full-bridge circuits 360 are essentially perpendicular to one another as illustrated by the arrows in FIG. 9. As a consequence, the sensor device 100 may be capable of providing at its four output signal terminals 120 sensor signals indicative of both a sine- and a cosine-contribution having a phase shift of approximately 90° in case of magnetic field sensor elements 330 using the—pinned layer to define their reference directions. Hence, the sensor device 100 may be a sensor device capable of detecting an angle of 360° of a magnetic field acting on the sensor device 100. In contrast, the sensor device 100 of FIG. 8 only provides a single or the previously-mentioned component signals. The sensor device 100 of FIG. 7 may be used, in contrast to that, as a 360°-sensor.

In the following, the concept of footprint of packages will be considered more closely. When a sensor package is mounted on a component board 210, it typically serves two purposes. The component board 210 holds the sensor package 100 in place and, hence, accommodates it mechanically, while it also establishes and enables electric contact of the sensor circuit 100 with other circuits via fine conductor traces on the surface of the component board 210. In other words, the board 210 may electrically couple the sensor circuit or sensor device 100 to other components and circuits.

Component boards 210 may comprise several conductive layers, which may be formed, for instance, from metallic materials. These layers may therefore be also referred to as metallization layers or interconnect layers. A conductive layer may, for instance, be formed on a top main surface of the component board 210. Optionally, a further conductive layer may be formed on bottom main surface. One or more additional conductive layers may be implemented within the component board 210 between the top and bottom main surfaces. Often these conductive layers are made from copper (Cu) and patterned via etching processes. However, the more conductive layers a component board comprises, the more expensive it may become to manufacture it. This is even more so, when the lateral geometrical tolerances need to be kept small, for instance, smaller than 75 μm, smaller than 50 μm or even smaller than 25 μm.

Embodiments may focus on methods and implementation how to use cheaper component boards 210, which may only comprise a single conductive layer. Although this conductive layer may be on any of both main surfaces of the board or even in-between, it may be more common to mount the packages on the same main surface, on which the conductive layer is arranged. Often this side is referred to as the top surface.

Sensor packages 100 may be implemented as surface mounted or surface mountable devices (SMD), which may be placed on the top surface of the board 210. The leads, lands or terminals of the sensor package 100 may touch in this case the conductive layer. The semiconductor manufacturer often recommends in this situation a footprint for each sensor package, which defines geometrical rules and shapes of how the conductor traces of the supply and signal lines may be shaped and placed in order to achieve reliable contact between conductor traces on the component board 210 and the sensor terminals 110, 120 of the sensor package 100.

In terms of the design, it might be advisable on the one side to define the conductor traces to be sufficiently large to carry the electric current and/or to have small enough resistance. Moreover, it may be advisable to define the solder interfaces between the conductor traces and the leads or lands of the sensor package to comply to several rules in order to be reliable.

On the other hand, it may be advisable to design the pitches between neighboring conductor traces to be wide enough to prevent accidental shorts between them. In this context, it might be interesting to consider that the leads of the sensor package 100 may be formed to be three-dimensional objects having comparably complicated shapes, for instance, comprising gull-wing-shaped structures. Moreover, the lands of the sensor packages 100 may comprise more than one surface exposed so that the sensor package 100 may has to be regarded as a three-dimensional object itself. However, the footprint is typically a two-dimensional object or structure and can, therefore, define the contact arrangement. In the case of leaded packages, which are different from SMD-packages, the component board 210 typically requires small holes, into which the leads of the leaded packages 100 are inserted prior to soldering. Embodiments may also apply to leaded packages, since only the footprint may be relevant in terms of the terminals 110, 120 of embodiments.

So far only the positions of supply and signal terminals 110, 120 of sensor chips 100 configured for flip-chip mounting have been described. Yet the same principle may also apply to SMD-sensor packages 100, as, for instance, shown in FIG. 10*a* and FIG. 10*b* for N=3 sensor packages 100.

Figure 10A:
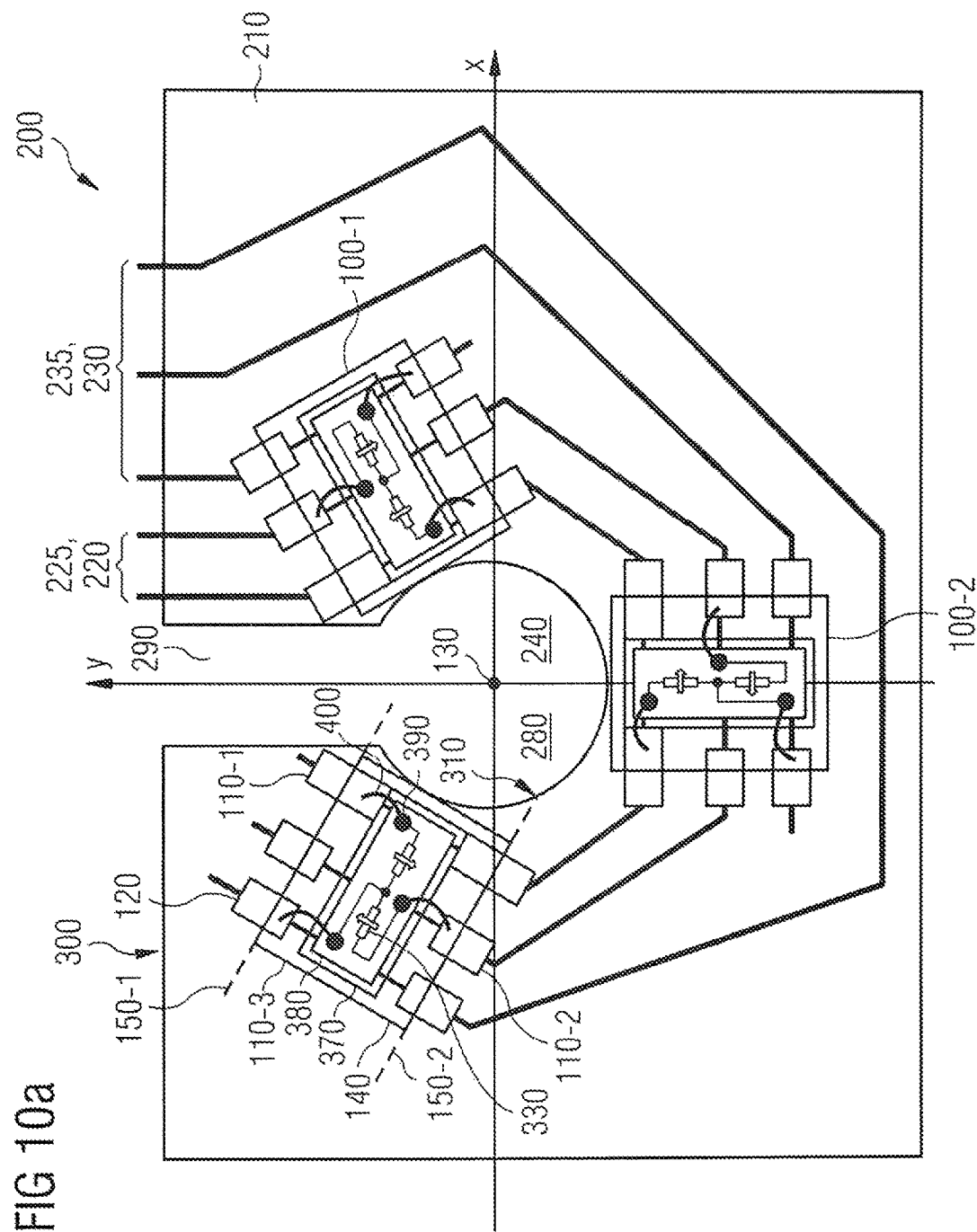
FIG. 10a shows a schematic plan view of a sensor arrangement according to an embodiment comprising three SMD sensor devices.

FIG. 10*a* shows a schematic plan view of a sensor arrangement 200 according to an embodiment comprising a component board 210, onto which three SMD sensor packages or sensor devices 100-1, 100-2, 100-3 are arranged around a reference point 130, which represents a central point or midpoint of a hole 280 of a recess 240. FIG. 10*b* shows the schematic plan view of FIG. 10*a* without the three SMD sensor devices 100.

The sensor devices 100 are arranged at angles of approximately 120° with respect to one another so that the sensor devices 100 are equally distributed with respect to the angle around the reference point 130.

The sensor devices 100 are coupled to the component board 210 and electrically connected to the supply lines 220 and, with respect to the supply lines 220, radially outwards arranged signal lines 230. The sensor devices 100 are coupled to the conductive lines 225, 235 of the board 210 by solder dots 315, only some of which are denoted by their reference signs in FIG. 10*b* for clarity reasons only. As described before, each of the sensor devices 100 comprises at least two supply terminals 110, 110-2, which are coupled to the respective supply lines 220. For the sake of simplicity only, the terminals are only referred to by their reference signs with respect to the third device 100-3. However, the sensor devices 100 as used in the sensor arrangement 200 of FIG. 10*a* are all identical and arranged in such a way that by rotating the sensor devices 100 by approximately 120°, the sensor devices 100 will simply be exchanged without affecting the actual functionality of the sensor arrangement 200, since the sensor devices are not only identical, but also oriented such that the previously-described rotation renders them invariant. Naturally, this is not necessary in other embodiments, but merely represents an option.

The sensor devices 100 further comprise a sensor signal output terminal 120 which is further away from the reference point 130 than any of the supply terminals 110. Each of the sensor signal output terminals 120 is coupled to a different signal line 230 of a plurality of signal lines 230. Apart from the previously-described supply terminals 110 and the sensor signal output terminal 120, the sensor devices 100 further comprise inactive or internally uncoupled terminals, which are not capable of providing a supply voltage or to carry a sensor signal. However, these inactive terminals may improve mechanical stability of the package soldered to the component board.

The sensor devices 100 comprise as housing 140 a molded body and an electrically-conducting surface 370, which is also referred to as die paddle. The die paddle, for instance, may be used to ground a die 380 of the sensor device 100 comprising the actual sensor elements 330. The conductive die paddle may be implemented so that the die paddle and the leads can be fabricated from a single metallic leadframe and at least one lead is coupled with the die paddle to hold the die in place during the molding procedure, where the die and at least parts of the die paddle are covered with mold compound.

The two most inner terminals, leads or pins of the housing 140 as shown in FIGS. 10*a* and 10*b* are in direct electrical contact to the surface 370 allowing, for instance, to electrically couple the surface 370 to ground potential as mentioned before.

The actual layout of the die 380 corresponds to that of the sensor device 100 as shown in FIG. 4, although instead of directly implementing the terminals 110, 120, the die 380 comprises a plurality of bond pads 390, enabling an electrical contact to the terminals 110, 120 by bond wires 400. In other words, in the embodiment shown in FIGS. 10*a* and 10*b*, the sensor chip or die 380 is coupled to the terminals 110, 120 of the sensor device 100 by the terminals of the actual sensor chip or die 380, which are implemented as bond pads 390.

As the plan view of the component board 210 further shows, the recess 240 further comprises an aperture 290 connecting the hole 280 with its reference point 130 and the outer perimeter 300 of the component board 210. The sensor devices 100 are arranged to be in close contact with the inner perimeter 310 of the hole 280 to allow a magnetic field source operating in or in the vicinity of the hole 280 to couple a sufficiently-high magnetic flux into the sensor devices 100 to help to strengthen a signal-to-noise-ratio compared to an implementation with the sensor devices 100 being further outwardly arranged with respect to the reference point 130.

In other words, FIG. 10*a* shows SMD-packages 100 with leads, yet also leadless SMD-packages 100 may be used here. The SMD-packages 100 are aligned so that the two rows 150-1, 150-2 of leads 110, 120 per package 100 are approximately oriented along the radial direction. The two innermost leads 120 coupled per package 100 are supply terminals 120, whereby the leads on both rows can be contacted with the respective supply terminal 120 or only on one row. In other words, for the two terminals of positive and negative supply there may be four leads available, although here only two are actually used. The signal leads 120 and the signal lines 230 are at larger radial distance from the reference point 130 than the supply leads 110 and supply lines 110.

Naturally, other examples of SMD packages may also be used, for instance, packages comprising leads or lands as terminals. FIG. 10*c* shows a perspective view of a SMD package for a sensor device 100 according to an embodiment. The package shown in FIG. 10*c* comprises leads 550 which may be used to directly mount and electrically contact the package and, hence, the sensor device 100 onto the board 210 (not shown in FIG. 10*c*).

FIG. 10*d* shows a similar perspective view of another SMD package for a sensor device 100 also comprising leads 550, which allow the package to be directly mounted onto the board 210. FIG. 10*e* shows a perspective view of a further SMD package for a sensor device 100 which does not comprise leads. It does, however, comprise lands 560 which may also be used to directly mount and electrically contact the package and, hence, the sensor device 100 onto the board 210 (also not shown in FIG. 10*e*).

In contrast to sensor devices comprising a package, in which the position of the terminals such as bumps, leads, lands and solder dots may determine the question of electrical contact and mechanical stability, in the case of a flip-chip implementation of a sensor device 100, the terminals on the die or chip of the sensor device 100 itself may determine the previous characteristics. While in a packaged implementation of a sensor device 100, an electrical connection between the terminals of the package and the die or chip of the sensor die has to be established, for instance, by using bond wires, implementing bond wires may eventually be skipped using the flip-chip technique.

In the case of a package sensor device 100, the terminals of the package fulfill the same functions than the terminals of the chip have in the case of a flip-chip device. For instance, in the case of a packaged sensor device, the positions of the terminals on the die may be chosen essentially arbitrarily as long as the terminals on the die are electrically coupled to the terminals of the package, for instance, by using bond wires. Naturally, in a real-life implementation, certain limitations may exist in terms of positioning the terminals on the die with respect to the terminals of the package, as, for instance, it may be advisable to prevent bond wires from crossing in the plan view of the die.

Similarly, it is possible to electrically contact or couple two half-bridge circuits 320-1, 320-2 or a full-bridge circuit 360 (not shown in FIGS. 11a and 11b). FIG. 11a shows a schematic plan view of a sensor arrangement 200 comprising a component board 210 with three SMD-style sensor devices 100 accommodating sensor elements 330 in the form of AMR-resistors. FIG. 11b shows the schematic plan view of FIG. 11a without the three SMD sensor devices 100. They may be implemented as magneto-resistors without a pinned layer. The straight lines inside the resistor symbols denote the direction of current flow through the sensor elements 330, which may, for instance, be defined by barber-pole stripes. Here the die paddle or surface 370 is electrically tied to the center pins on both sides of the chip package 100, which may be used to connect the device 100 to ground.

Since the sensor devices 100 comprise two half-bridge circuits 320 each, the number of sensor signal output terminals 120 actively used is higher by a factor 2 compared to the implementation of FIGS. 10a and 10b. Hence, also the number of signal lines 230 is higher—to be precise, by a number of 2—than in the previously described embodiment.

Figure 12A:
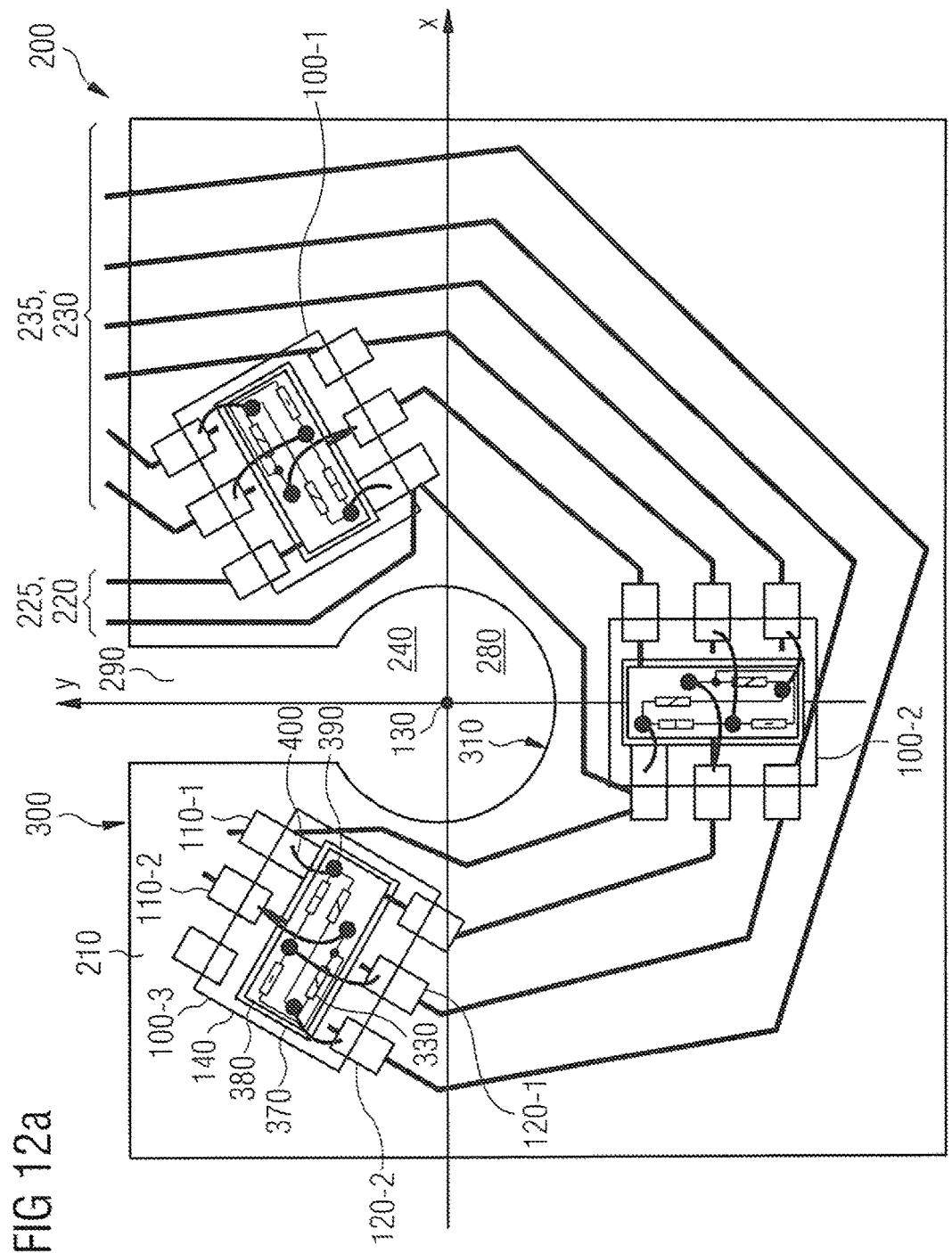
FIG. 12a shows a schematic plan view of a sensor arrangement according to an embodiment comprising three SMD sensor devices, each accommodating two half-bridge circuits of AMR sensor elements.

FIG. 12a shows an alternative embodiment of a sensor arrangement 200, which is similar to the one shown in FIG. 11a and 11b. FIG. 12a also shows a plan view of a sensor arrangement 200 comprising a component board 210, on which three SMD-style sensor devices 100 are arranged, each comprising two half-bridge circuits based on AMR-sensor elements 330. FIG. 12b again shows the corresponding plan view of FIG. 12a without the sensor devices 100.

Here one signal output terminal 120 has the same distance to the reference point 130 as one supply terminal 110. As a consequence, the sensor chip 100 with or without its sensor package may be configured to be arranged with respect to the reference point 130 in the common plane defined by the terminals and the board 210 such that no footprint portion of the at least one signal output terminal 120 is closer to the reference point 130 than any footprint portion of the supply terminals 110.

On the one hand, the arrangement 200 may comprise a larger distance of the sensor chips or sensor packages 100 from the central hole 280 and its reference point 130 compared to the previously described sensor arrangement. The approximately circular ground line as part of the supply line 220 may be placed between the hole 280 and the sensor packages 100. On the other hand, this arrangement 200 may offer the possibility of using three of the six leads or terminals per package 100 for signal output terminals 120. However, in the embodiment shown, only two are used.

Figure 13A:
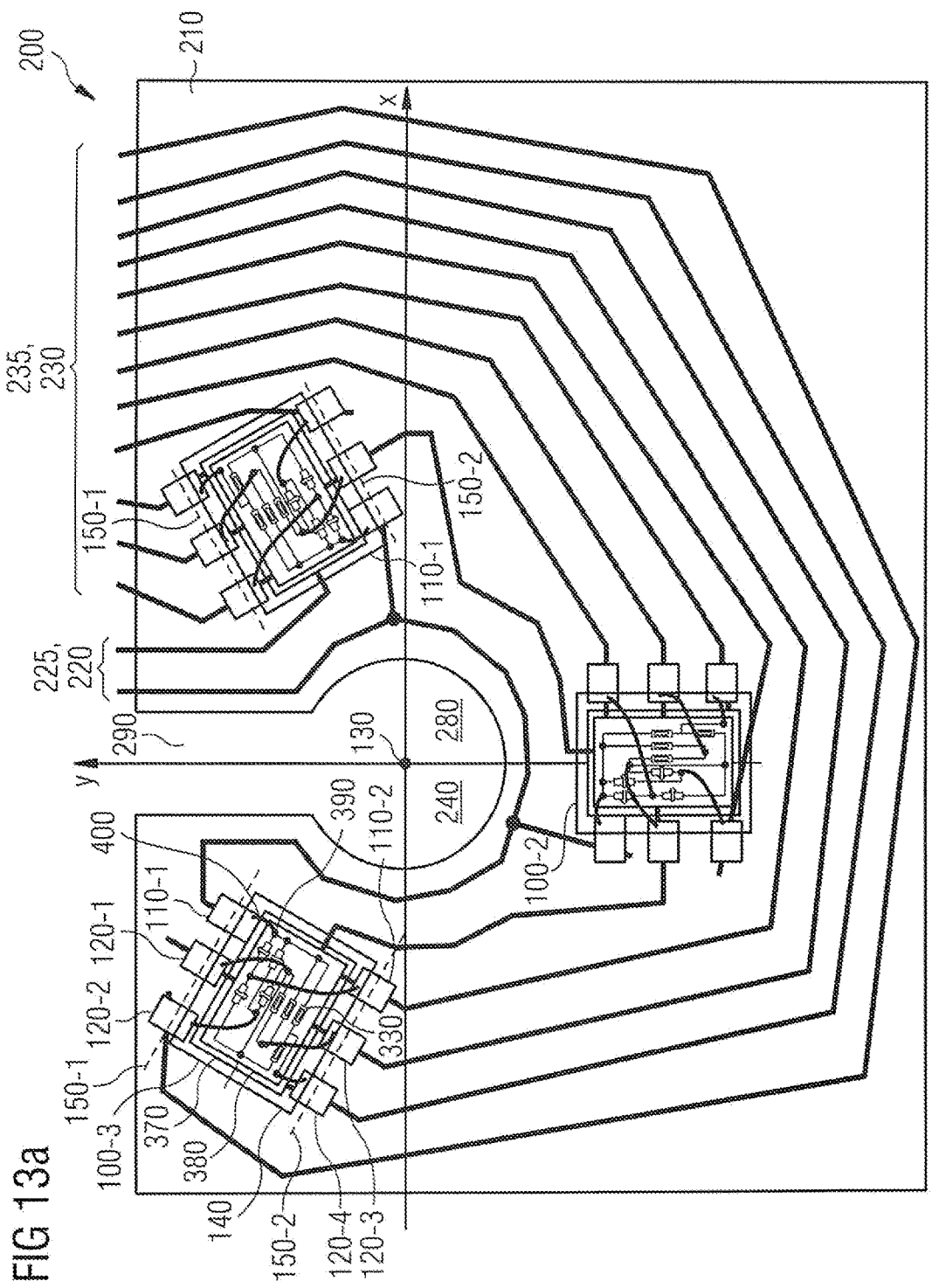
FIG. 13a shows a schematic plan view of a sensor arrangement according to an embodiment comprising three sensor devices comprising each two full-bridge circuits.

The sensor package 100 as shown in FIG. 13a each have two rows 150 of terminals. The supply contacts 110 are in only one of the two rows and immediately neighboring terminals.

FIG. 13a shows a schematic block diagram of a sensor arrangement 200 comprising three SMD-sensor packages 100 each comprising two full-bridge circuits 360 (reference sign not used in FIG. 13a for clarity reasons only) of magneto-resistive sensor elements 330 with pinned layers. For instance, the sensor elements may be TMR-based sensor elements 330. The sensor packages 100 may be identically implemented and arranged and oriented with respect to the reference point 130 to be rotationally invariant with respect to a rotation of approximately 120°. FIG. 13b shows the corresponding plan view of FIG. 13a without the sensor devices 100.

Each SMD-sensor package 100 comprises six terminals, which may be implemented as leads or pins, two of which are used for power supply (supply terminals 110) and four of which are used for output signals (sensor signal output terminals 120). The arrangement 200 avoids crossings of conductor traces on the component board 210. As a consequence, a single conductive or interconnect layer on the board 210 may be enough to establish all necessary electrical contacts.

The sensor device 100 may, for instance, comprise an arrangement of terminals 110, 120 of at least one sensor chip or die 380—with or without sensor package—, which comprises at least one sensor element 330 or sensor circuit. It may further comprise at least two supply terminals 110 configured to supply the sensor element 330 or sensor circuit with electric power. At least one signal output terminal 110 may be configured to provide the output signal of the sensor element 330 or sensor circuit. The at least two supply terminals 110 and the at least one signal terminal 120 may be contactable by a footprint in a plane, wherein the footprint portions of the at least two supply terminals 110 and of the at least one signal terminal 120 are arranged in at least one row 150. The sensor chip 380 with or without its sensor package may be configured to be arranged with respect to a reference point 130 in the plane such that no footprint portion of the at least one signal output terminal 120 is a member of the at least one row comprising the supply terminals 110 and is closer to the reference point 130 than any footprint portion of the supply terminals 110 of this same row 150.

An arrangement of terminals of at least one sensor chip or die 380 with or without sensor package 100 may, for instance, comprise at least one sensor element 330 or sensor circuit, at least two supply terminals 110 configured to supply the sensor element 330 or sensor circuit with electric power and at least one signal output terminal 120 configured to provide the output signal of the sensor element 330 or sensor circuit. The at least two supply terminals 110 and the at least one signal terminal 120 may be contactable by a footprint in a plane, wherein the sensor chip or die 380 with or without its sensor package may be configured to be arranged with respect to the reference point 130 in the plane such that no footprint portion of the at least one signal output terminal 120 is closer to the reference point 130 than any footprint portion of the supply terminals 110.

Optionally, the main surface of the sensor chip 380 with or without sensor package may be parallel to the plane. Moreover, optionally, all footprint portions of the at least two supply terminals 110 may be closer to the reference point 130 than any footprint portion of the at least one signal output terminal 120. Optionally, the at least one signal output terminal 120 may be coupled to the output (node 340) of a half-bridge circuit 320 comprising magneto-resistors 330 on the at least one sensor chip or die 380 with or without sensor package. Optionally, the at least one signal output terminal 120 may comprise at least two signal output terminals 120. For instance, the signal output terminal 120 may be directly coupled with the corresponding node 340 arranged in between two magneto-resistive sensor elements (magneto-resistors 330).

As outlined before, the at least one sensor element 330 may be or may comprise a magnetic field sensor element. Apart from the previously mentioned magneto-resistive sensor elements 330, they may further come from a group comprising Hall plates, vertical Hall effect devices or sensor elements, magnetic field effect transistors (MAG-FETs) and magneto-resistors (magneto-resistive sensor elements). Some of these magnetic sensor elements 330 may comprise at least one magnetically pinned layer. Examples of these sensor elements comprise, for instance, GMR-, TMR- and CMR-based sensor elements 330. However, also sensor elements 330 without pinned layers may naturally be implemented, to which, amongst others, AMR-based sensor elements 330 belong.

Optionally, the magneto-resistors or magneto-resistive sensor elements may be connected to at least one half-bridge circuit 320 or to at least one full-bridge circuit 360 or to at least two half-bridge circuits 320 or to at least two full-bridge circuits 360, to name just a few examples. Optionally, the at least one sensor chip or die 380 or sensor package 100 may comprise two or more sensor chips 380 or sensor packages 100 arranged on a component board 210 around a reference point 130. The two or more sensor chips or dies 380 may be mounted using a flip-chip-technique on the component board 210. Naturally, the two or more sensor chips or dies 380 may also be housed in leaded or leadless SMD packages or even in leaded packages for through hole mounting. The component board 210 may comprise conductor traces or lines 220,230 to contact the terminals 210, 220 of the two or more sensor chips or dies 380 or the sensor packages 100.

The conductor traces used to contact output signal terminals of the two or more sensor chips or dies 380 or sensor packages 100 may be designed to not cross or overlap or touch in a plan view onto the main surface of the component board 210. All conductor traces used to contact the output signal terminals of the two or more sensor chips or dies 380 or sensor packages 100 may, for instance, comprise parts of no more than one conductive or interconnect layer of the component board 210. However, the board 210 may comprise other parts like jumpers.

Optionally, the two or more sensor chips or dies 380 or sensor packages 100 may be arranged around a recess 240 or a hole 280 in the component board 210. The component board 210 may further comprise an aperture 290 between its perimeter 300 and the hole 280, which may be part of the recess 240.

Moreover, an embodiment may further comprise a sensor system comprising at least three sensor chips or dies 380 with or without sensor packages or corresponding housings 140. In other words, the system may comprise, for instance, three or more sensor devices 100.

Each sensor chip, die 380 or device 100—with or without sensor package or housing—may comprise at least two supply terminals 110. Moreover, each sensor chip or die 380 with or without a sensor package may comprise at least one signal output terminal 120 capable of providing a signal indicative of a strength, direction and/or other parameters of a magnetic field acting on the respective sensor chip or die 380 (with or without its sensor package). The at least two supply terminals 110 and the at least one signal output terminal 120 of the at least three sensor chips 380 (with or without sensor packages) or sensor devices 100 may be coupled to respective footprint portions on the main surface of a component board 210. The at least three sensor chips 380 or sensor packages 100 may be arranged on a component board 210 around a reference point 130 in such a way that for each sensor chip or die 380 (with or without sensor package or housing) there is no signal terminal 120 closer to the reference point 130 than the at least two supply terminals 110.

Optionally, the sensor elements 330 on all of the at least three sensor chips or dies 380 may be oriented in such a way with respect to the reference point 130 that their orientations can become identical, when they are rotated by the same angle as their positions are rotated around the reference point 130. The positions of the sensor devices 100 or its dies 380 may be invariant under a rotation in some embodiments.

Embodiments may, therefore, relate to a terminal arrangement of a sensor chip or a package. For instance, a sensor arrangement 200 according to an embodiment may comprise a board 210 comprising at least two supply lines 220, at least three signal lines 230 and a hole 280 with a reference point 130. It may further comprise at least three sensor devices 100 mechanically accommodated on the board 210 and oriented toward the reference point 130, each sensor device 100 being electrically coupled to the at least two supply lines 220 by at least two supply terminals 110 of the sensor device 100 and to at least one signal line 230 by at least one sensor signal output terminal 230 to provide a sensor signal to the at least one signal line 230, wherein the sensor signal may be indicative of a magnetic field or a property thereof, such as its strength and/or its direction, acting on the sensor device 100. The at least two supply lines 220 may be arranged radially inside of the plurality of signal lines 230 with respect to the reference point 130. The at least two supply terminals 110 may be closer to the reference point 130 then any sensor signal output terminals 120 of the sensor devices 100.

Embodiments have a wide range of possible applications. Examples come, for instance, from the field of magnetic sensor systems. Such a sensor system may, for instance, comprise several sensor chips or sensor packages 100 arranged on a circuit board around a center. FIG. 14 shows a perspective view of a first example of a sensor system 500 comprising a sensor arrangement 200 according to an embodiment. The arrangement 200 comprises a board 210 in the form of a printed circuit board (PCB) mechanically accommodating a plurality of sensor devices 100. The board 210 comprises a hole 280, through which a shaft 510 with a diametrically magnetized magnet 520 attached to it is mounted. The magnet 520 is arranged such that the magnetic field caused by the magnet 520 acts on the devices 100. The board 210 further holds an evaluation circuit 530, to which the sensor devices 520 are coupled to receive the corresponding sensor signals. The reference point 130 (not shown in FIG. 14) may, for instance, be the center point of the hole 280 (recess 240).

Figure 16:
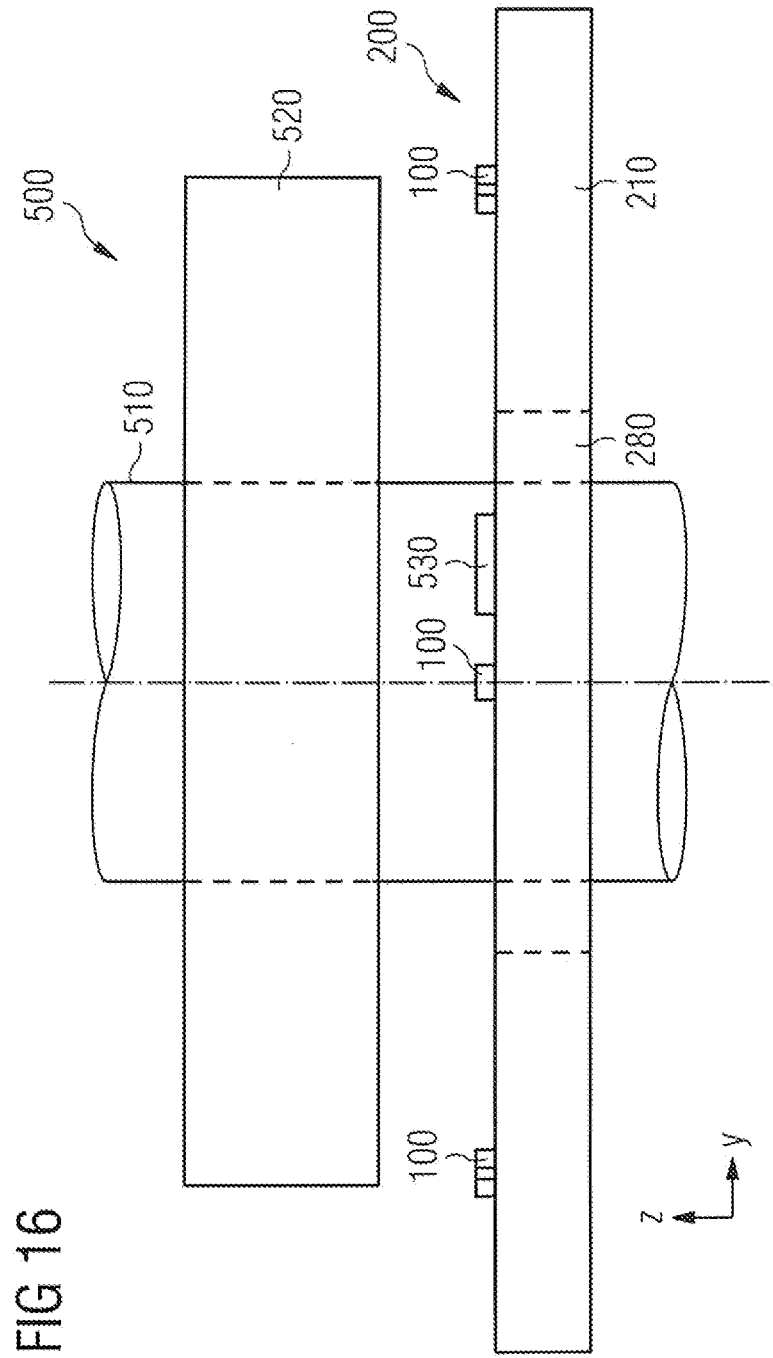
FIG. 16 shows a cross-sectional view of the sensor system of FIG. 15.

FIG. 15 shows a perspective view and FIG. 16 a side view of a further sensor system 500. The sensor system shown in FIGS. 15 and 16 differs from the one shown in FIG. 14 for instance with respect to the arrangement of the magnet 520. While in the system 500 of FIG. 14 the magnet 520 was on a similar or even same level than the sensor devices 100, here the magnet 520 is vertically displaced with respect to the board 210 and its sensor devices 100. In other words, the magnet is displaced along a direction perpendicular to the plane formed by the terminals 110, 120 (not shown in FIGS. 15 and 16) and/or along a symmetry axis of the shaft 510. Moreover, the recess 240 further comprises an aperture 290 allowing a simpler fabrication or mounting of the arrangement 200.

In the systems 500 shown in the FIGS. 14,15 and 16 the ring magnet 520 is fixed to the shaft 510 and several sensor chips 100 are attached to a component board 210 and arranged around a central hole 280 (recess 240). The sensor signals can be combined in an ASIC (application-specific integrated circuit) as an example of an evaluation circuit 530, which may be capable of measuring the rotational position of the magnet 520.

This off-axis type of magnetic angle sensor system 500 might be competitive to on-axis angle sensor systems, which may only need a single chip, if the chips 100 for the off-axis sensor and the component board 210 may be cheap. So these sensor chips 100 might comprise or even contain only as few elements as possible and be as small as possible. For instance, they might even contain only one or two discrete half bridge-circuits of magneto-resistors, such as TMR-based sensor elements.

Moreover, the component board 210 may be a cheap single metal layer board 210 with cheap and thus coarse patterns. As a consequence, the contacts or terminals 110, 120 (not shown in FIGS. 14, 15 and 16) of the sensor chips 100, for instance in case of a flip-chip assembly, or the leads or lands of the sensor packages 100 in case of packaged sensors 100 may have to fulfill certain requirements to reduce or even minimize system costs. Embodiments may be used here.

Figure 17:
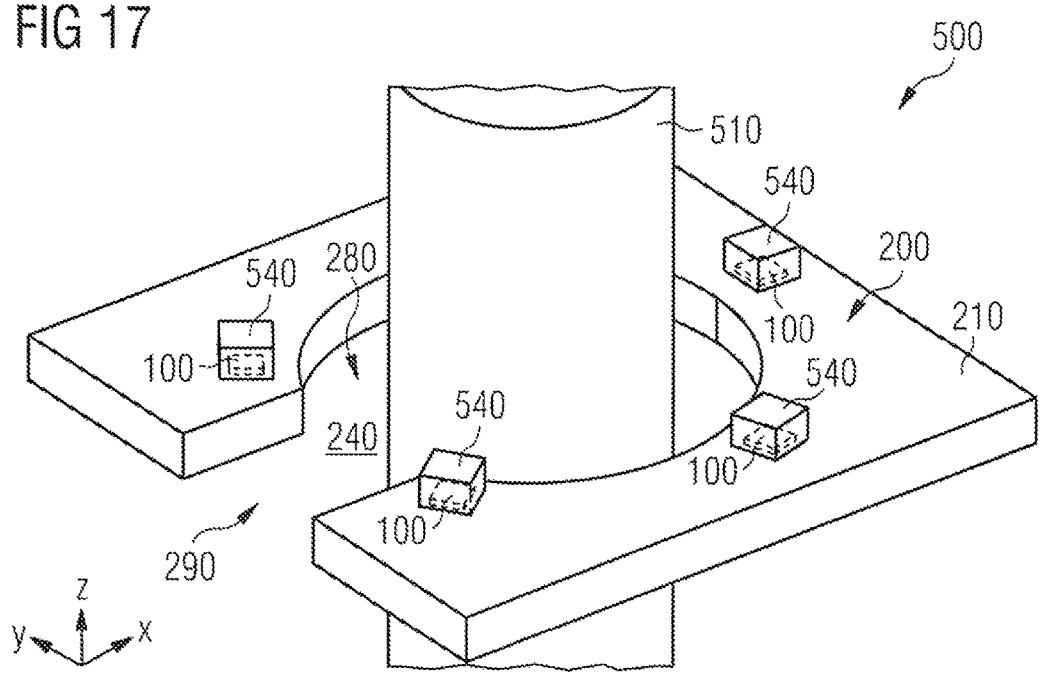
FIG. 17 shows a perspective view of a further sensor system comprising a sensor arrangement according to an embodiment.
Figure 18:
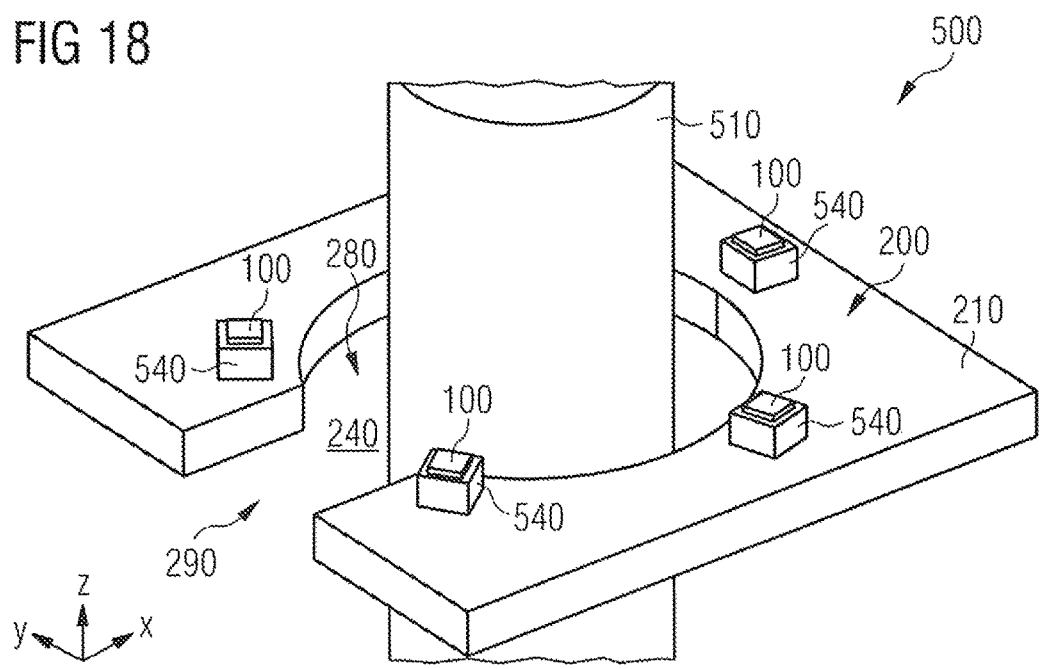
FIG. 18 shows a perspective view of a sensor system comprising a further sensor arrangement according to an embodiment.

FIGS. 17 and 18 show perspective views of two further sensor systems 500 based on using currents to create a magnetic field, which may then be detected by, for instance, TMR-based sensor elements. Again these systems 500 comprise a sensor arrangement 200 with a component board 210 carrying several sensor chips 100 along with bias magnets 540 attached to the sensor devices 100. The board 210 comprises a central opening or hole 280 as part of a recess 240 further comprising an aperture 290. Through the hole 280 a conductor is guided, which may, for instance, be integrated into or attached to a shaft 510. When a current flows through the conductor, the sensor chips 100 may be able to detect its associated magnetic field and thus measure the current. Again, here a central opening 280 in the board 210 and several sensor chips 100 may be arranged around this opening 280. In order to make the system 500 cheap, the sensor chips 100 may comprise simple sensor elements 330 only, for instance, like TMR-based sensor elements. Their contacts or terminals may be arranged such that a single metallization layer or interconnect layer of the component board 210 may be enough to provide all signals to a processing unit or evaluation circuit 530, which may, for instance, compute the current.

Figure 19A:
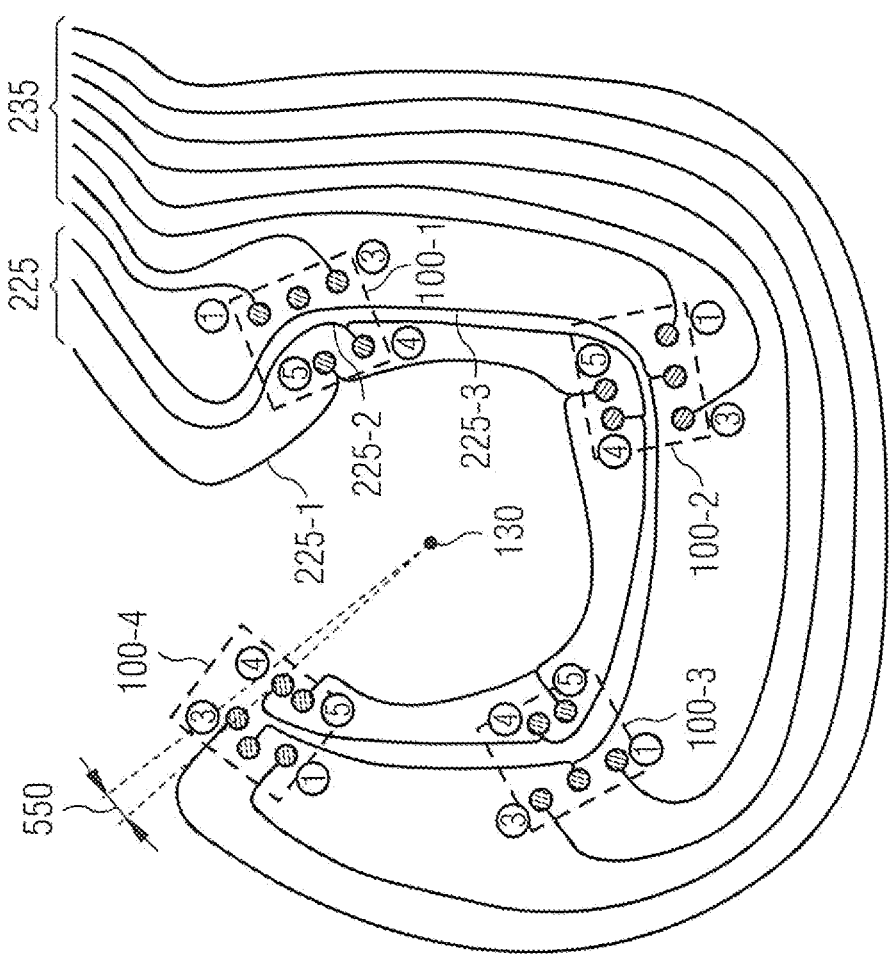
FIG. 19a shows a simplified layout of a sensor arrangement according to an embodiment.

FIG. 19a shows a simplified layout diagram of a sensor arrangement comprising four sensor devices 100, which are illustrated in FIG. 19a by dashed lines indicating the outer boundaries of the devices 100. Moreover, the terminals or rather the footprint of the devices 100 are labelled by encircled numbers 1 to 5. As will be laid out below, FIG. 19b shows a simplified diagram of a sensor device 100 as implemented in FIG. 19a.

The sensor arrangement comprises three conductive lines of the first type 225-1, 225-2, 225-3 along with eight conductive lines of the second type 235. As outlined before, with respect to the center point or reference point 130, the conductive lines of the first type 225 are essentially arranged radially inward with respect to the conductive lines of the second type 235. However, for some angles, the strict radially inward arrangement of the conductive lines of the first type 225 with respect to those of the second type 235, may be lifted. However, this is only true for a small fraction of angles. As a consequence, essentially for at least a significant portion of, for instance, at least 75%, 85% or even 90% the conductive lines of the first type 225 are still radially inside of those of the second type 235. To be more precise, in FIG. 19a, a range of angles 550 of approximately 5° may exist, in which only one conductive line of the second type 235 is arranged with respect to the reference point 130 without a corresponding conductive line of the first type 225 being arranged radially inside. This represents an example of a situation, in which the previously-mentioned radially inward arrangement of the conductive lines is lifted, for at least a small range of angles 550.

Figure 19B:
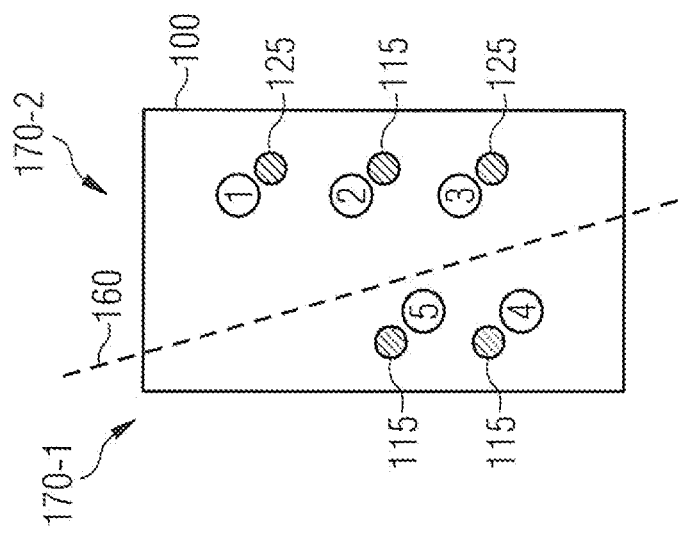

FIG. 19b shows a simplified diagram of a sensor device 100 comprising the corresponding arrangement of terminals of the first type 150 and of the terminals of the second type 125. Once again, FIG. 19b shows the intersecting plane 160 sub-dividing the sensor device 100 into a first portion 170-1 and a second portion 170-2, wherein the first portion 170-1 only comprises terminals of the first type 115 and the second portion only comprises terminals of the second type 125 apart from at most one terminal of the first type 115.

Figure 20B:
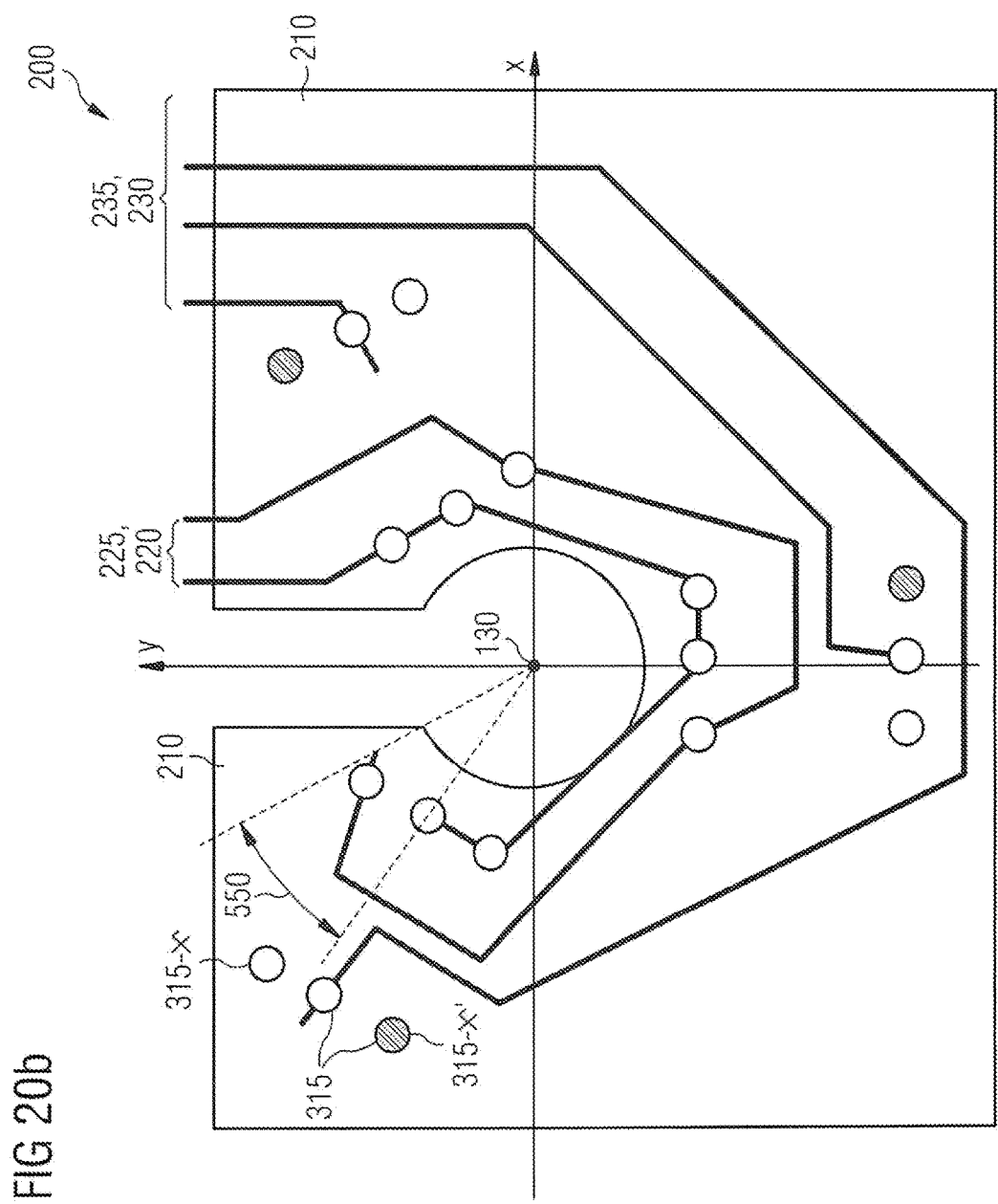
FIG. 20b shows the sensor arrangement of FIG. 20a without the sensor devices.

Although in many examples previously presented the conductive lines of the first type 225 mainly comprise supply lines for providing the respective devices 100 with electrical energy, the conductive lines of the first type 225 and, correspondingly, also the terminals of the first type 115 may comprise further lines and terminals, respectively. For instance, if the device 100 requires more than just one supply voltage, an additional supply line and a corresponding supply terminal may be implemented to provide the device 100 with at least two different supply voltages, for instance, with respect to a common reference potential (ground). Moreover, the conductive lines of the first type 225 as well as the corresponding terminals of the first type may further comprise, for instance, a common clock line, a common synchronization line or the like. FIG. 20a shows a simplified outline of a sensor arrangement 200 according to an embodiment. FIG. 20b shows the corresponding layout of the sensor arrangement 200 without the sensor devices 100 shown. Therefore, FIG. 20b allows a more clear view of the signal lines of the first and second types 225, 235. However, with respect to the further details, FIGS. 20a and 20b are similar to, for instance, those of FIGS. 11a and 11b.

As shown in FIGS. 20a and 20b, the sensor devices 100 each comprise one terminal X and the board 210 a corresponding solder dot 315-X, which are implemented for mechanical stability reasons only or mainly. Neither the terminals X nor its corresponding solder dots 315-X are electrically coupled to other circuit elements of the sensor device 100 and of the board 215, respectively. Hence, they may be considered in terms of the sensor device 100 as being galvanically or electrically function-free, as no current or information is transported via these structures. Also in this case, the conductive lines of the first type 225 are essentially arranged radially inside of the conductive lines of the second type 235 such that the corresponding conductive lines 225, 235 on or in the board 210 do not cross. However, at some angles the radial arrangement described above is not strictly implemented. Nevertheless, the number of angles with respect to the overall angles at which at least one conductive line of the first type 225 and at least one conductive line of the second type 235 are arranged, is comparably small as outlined and described before.

The solder dot 315-X' may, optionally, be coupled to ground potential via the lead frame structure of the sensor package 140 and the corresponding conductive line of the first type 225 coupling the sensor device 100 to ground potential. However, as outlined before, both the solder pad 315-X' and its corresponding terminal X' also serve the purpose of mechanically stabilizing the sensor package to the board 210.

Figure 21B:
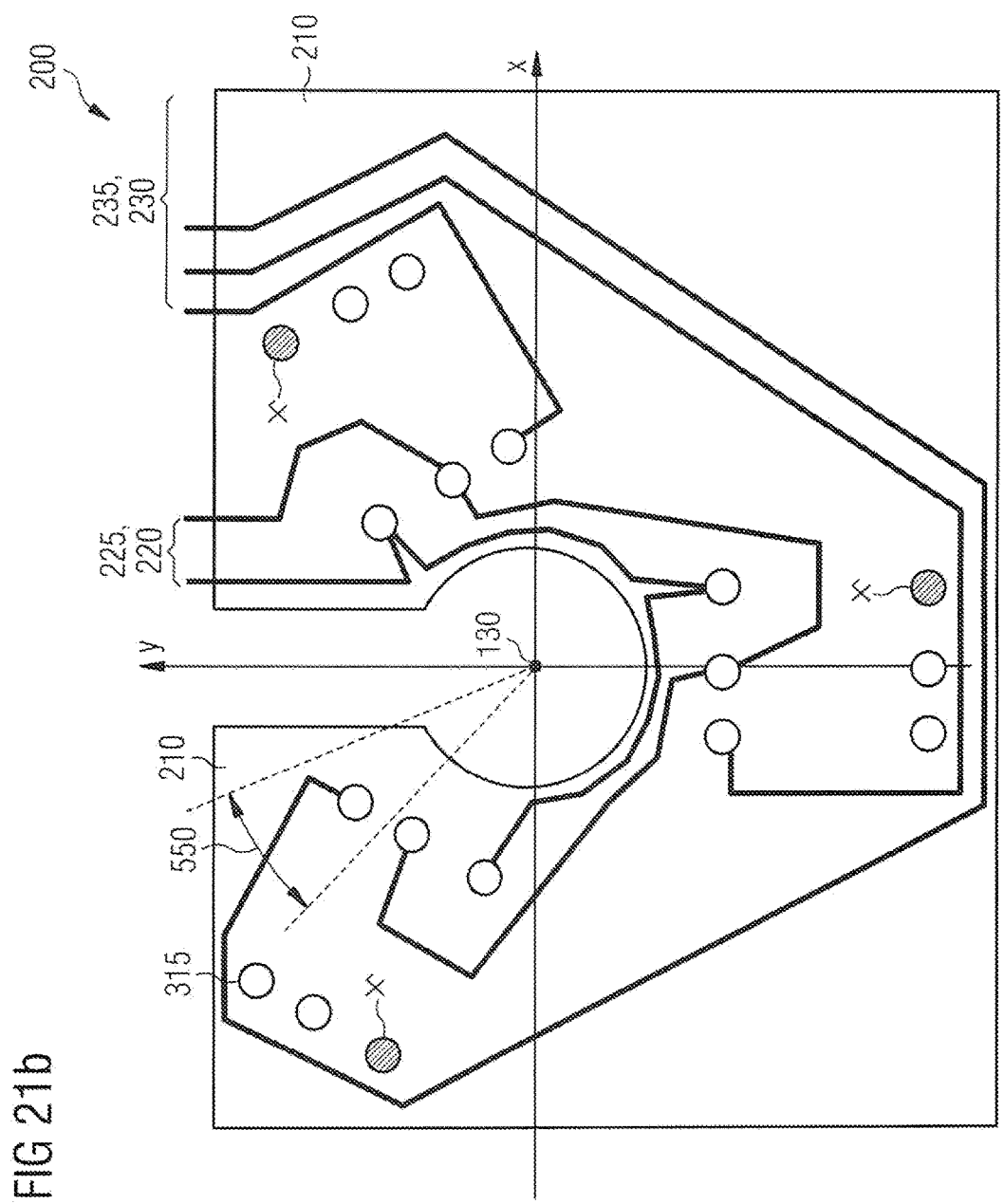
FIG. 21b shows the plan view of FIG. 21a without the sensor devices.

FIGS. 21a and 21b show a similar situation for a further sensor arrangement 200 according to an embodiment. FIG. 21b shows a corresponding layout without the sensor devices shown. Once again, the overall radial arrangement as described before is implemented also here. However, for some angles, once again, the previously-described radial arrangement is deviated from. However, the number of angles or the fraction of angles is comparably small such that essentially the previously-described arrangement of the conductive lines 225, 235 is still valid. For instance, for the angle range 550 as depicted in FIG. 21b, only a conductive line of the second type 235 exists without a conductive line of the first type 225 being radially inwardly arranged. The same situation is also depicted in FIG. 20b but with the roles of the first and second conductive lines 225, 235 being interchanged. In FIG. 20b, in the angle range 550 only a conductive line of the first type 225 exists with a conductive line of the second type 235 being arranged radially outwardly.

Naturally, other applications may also be used together with an embodiment. Using an embodiment may allow an easier implementation of a device 100 and/or a sensor arrangement 200.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A sensor arrangement comprising:
a board comprising a plurality of conductive lines of a first type, a plurality of conductive lines of a second type different from the conductive lines of the first type, and a recess; and
a plurality of sensor devices mechanically accommodated on a main surface of the board and arranged around the recess, each sensor device being electrically coupled to the conductive lines of the first type and at least to one of the conductive lines of the second type, wherein each conductive line of the second type electrically couples a sensor device with at least one other item different from the sensor devices of the plurality of sensor devices,
wherein a projection of the conductive lines of the first and second types perpendicular to the main surface is crossing-free; and
wherein each conductive line of the first type electrically couples at least all of the plurality of sensor devices.

2. The sensor arrangement according to claim 1, wherein the recess goes through the board in a direction perpendicular to the main surface.

3. The sensor arrangement according to claim 1, wherein recess comprises a regular shaped hole comprising a center point.

4. The sensor arrangement according to claim 3, wherein the regular shape is circular shape, an elliptical shape or a polygonal shape.

5. The sensor arrangement according to claim 3, wherein the sensor devices each comprise a predefined, device-specific orientation direction, and wherein the plurality of sensor devices are oriented with respect to the center point such that the orientation direction points towards the center point.

6. The sensor arrangement according to claim 3, wherein the sensor devices are oriented towards the center point such that by rotating the sensor arrangement around the center point by an angle equal to an angle between two sensor devices with respect to the center point, an orientation of at least one of the two sensor devices becomes identical to the other one of the at least two sensor devices.

7. The sensor arrangement according to claim 3, wherein the recess further comprises an aperture connecting an outer perimeter of the board and the hole.

8. The sensor arrangement according to claim 1, wherein the conductive lines of the first type are essentially arranged radially inside of the conductive lines of the second type with respect to the recess.

9. The sensor arrangement according to claim 8, wherein the conductive lines of the first type are arranged radially inside of the conductive lines of the second type with respect to at least 75% of all angles, along which at least one conductive line of the first type and at least one conductive line of the second type are arranged.

10. The sensor arrangement according to claim 1, wherein the conductive lines of the first and second types comprise traces arranged in a single conductive layer of the board.

11. The sensor arrangement according to claim 10, wherein all traces of the conductive lines of the first and second types are arranged in a single conductive layer of the board.

12. The sensor arrangement according to claim 1, wherein the board comprises exactly a single conductive layer.

13. The sensor arrangement according to claim 1, wherein the sensor devices are identical.

14. The sensor arrangement according to claim 1, wherein the plurality of sensor devices comprises at least three sensor devices.

15. The sensor arrangement according to claim 1, wherein the conductive lines of the first type comprise conductive lines to supply the sensor devices with electrical energy, and wherein the conductive lines of the second type comprise conductive lines to carry output sensor signals of the sensor devices.

* * * * *